(12) United States Patent
Oka

(10) Patent No.: US 9,412,914 B2
(45) Date of Patent: Aug. 9, 2016

(54) LIGHT EMITTING DEVICE

(75) Inventor: Yuta Oka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/234,644

(22) PCT Filed: Jun. 25, 2012

(86) PCT No.: PCT/JP2012/066107
§ 371 (c)(1),
(2), (4) Date: Mar. 10, 2014

(87) PCT Pub. No.: WO2013/015058
PCT Pub. Date: Jan. 31, 2013

(65) Prior Publication Data
US 2014/0197431 A1 Jul. 17, 2014

(30) Foreign Application Priority Data
Jul. 25, 2011 (JP) .................................. 2011-162623

(51) Int. Cl.
*H01L 33/50* (2010.01)
*H01L 25/075* (2006.01)
*H01L 33/54* (2010.01)

(52) U.S. Cl.
CPC ............ *H01L 33/50* (2013.01); *H01L 25/0753* (2013.01); *H01L 33/504* (2013.01); *H01L 33/54* (2013.01); *H01L 2224/48137* (2013.01)

(58) Field of Classification Search
CPC ..................................................... H01L 33/50
See application file for complete search history.

(56) References Cited

U.S. PATENT DOCUMENTS

| 2006/0087847 A1* | 4/2006 | Yamanaka ..................... 362/277 |
| 2009/0114929 A1 | 5/2009 | Lee et al. |
| 2009/0166657 A1 | 7/2009 | Yamada et al. |

(Continued)

FOREIGN PATENT DOCUMENTS

| EP | 2 233 819 A1 | 9/2010 |
| EP | 2 290 279 A2 | 3/2011 |

(Continued)

OTHER PUBLICATIONS

Paragon Semiconductor Lighting Technology Co., Ltd., E-Series.
(Continued)

*Primary Examiner* — Khaja Ahmad
(74) *Attorney, Agent, or Firm* — Foley & Lardner LLP

(57) ABSTRACT

Provided is a light emitting device having a high light emitting efficiency and a good brightness distribution, further having a good color mixing and a good light distribution. A light emitting device includes a base member, a plurality of light emitting elements disposed on the base member, and a sealing member sealing the light emitting elements. The base member has a plurality of regions divided by virtual lines extending in a radial manner from one point disposed on the base member to an outer periphery of the base member, and a light transmissive wall member between adjacent two regions of the plurality of regions. A sealing member containing a fluorescent material is disposed on each region of the plurality of regions. A color tone of light emitted from a first region which is one of the two adjacent regions of the plurality of regions differs from a color tone of light emitted from a second region which is the other of the two adjacent regions.

17 Claims, 10 Drawing Sheets

(56) References Cited

U.S. PATENT DOCUMENTS

| | | | |
|---|---|---|---|
| 2010/0078664 A1* | 4/2010 | Helbing | 257/98 |
| 2010/0207134 A1* | 8/2010 | Tanaka | F21K 9/00 257/89 |
| 2011/0037388 A1* | 2/2011 | Lou | F21K 9/135 315/35 |
| 2011/0116252 A1 | 5/2011 | Agatani et al. | |
| 2011/0278605 A1* | 11/2011 | Agatani et al. | 257/89 |
| 2011/0278606 A1 | 11/2011 | Suzuki et al. | |
| 2012/0007112 A1 | 1/2012 | Yamada et al. | |

FOREIGN PATENT DOCUMENTS

| | | |
|---|---|---|
| JP | 2008-160061 A | 7/2008 |
| JP | 2009-135485 A | 6/2009 |
| JP | 2009-164157 A | 7/2009 |
| JP | 3156731 U | 12/2009 |
| JP | 2010-034184 A | 2/2010 |
| JP | 2010-263128 A | 11/2010 |
| JP | 2012-4519 A | 1/2012 |
| WO | WO-2010/090289 A1 | 8/2010 |
| WO | WO-2010/104046 A1 | 9/2010 |

OTHER PUBLICATIONS

Extended European Search Report dated Feb. 11, 2015 issued in Application No. 12817372.1.

* cited by examiner

LIGHT EMITTING DEVICE

BACKGROUND OF THE INVENTION

1. Technical Field

The present invention relates to a light emitting device that can be used for lighting apparatus such as LED bulbs and spotlights.

2. Background Art

Generally, it has been known that light emitting devices using a light emitting element are compact and emit light of a clear color with good power efficiency. The light emitting elements according to the present invention are semiconductor elements, and are not prone to burn out, and in addition, have features such as excellent initial driving characteristics, durability to endure vibration, and repetitive ON/OFF operations. Due to such excellent properties, a light emitting device using a light emitting element such as a light emitting diode (LED) or a laser diode (LD) has been used as various light sources.

The light emitting device is mainly made of a light emitting element, a base member on which the light emitting element is disposed and has an electrically conductive wire which electrically connects the light emitting device with an external power source etc., and a sealing member covering the light emitting element on the base member. Also, there is a type in which a resin frame is formed around the light emitting element, as in a surface-mounting type COB (Chip on Board). Further, there is a light emitting device in which a fluorescent material is contained in a sealing member to obtain an emission of a mixed color light of light from the light emitting element and light whose wavelength has been converted by the fluorescent material.

In the light emitting device using fluorescent materials as described above, an absorption spectrum of a longer wavelength side (for example a CASN-based fluorescent material which emits a red light) partially overlaps with an emission spectrum of a shorter wavelength side (for example a YAG-based fluorescent material which emits a yellow light). Accordingly, a part of wavelength-converted light by the shorter wavelength side fluorescent material is absorbed by the longer wavelength side fluorescent material and decreases the light emitting efficiency, resulting in a decrease in the output power of the light emitting device. In order to improve the color rendering properties, a third fluorescent material (for example, a chlorosilicate which emits green light) which can compensate the absorbed wavelength is needed. However, inclusion of chlorosilicate leads the use of not only the blue light emission of the light emitting element (hereinafter may be called a blue light emitting element, and in a similar manner, for other colors, for example, a light emitting element which emits a blue-green light may be called a blue-green light emitting element) but also green light from a green fluorescent material for excitation of a fluorescent material which emits a red light (hereinafter may be called a red fluorescent material, and in a similar manner, for other colors, for example, a fluorescent material which emits yellow color may be called a yellow fluorescent material and a fluorescent material which emits green light may be called a green fluorescent material), which may result in a decrease in the light emitting efficiency.

For this reason, a light emitting device has been proposed in which two kinds of fluorescent material regions (regions containing fluorescent materials respectively) are separated (for example, see Patent Literature 1). In the light emitting device described in Patent Literature 1, a green sealing resin containing a green fluorescent material and sealing a first blue light emitting element and a red sealing resin containing a red fluorescent material and sealing a second blue light emitting element are separated by a dividing wall.

For example, the light emitting devices according to Patent Literature 2 and Non-patent Literature 1 respectively include two fluorescent material regions of an incandescent lamp color region which is an inner side region and a white color region which is an outer side region. The incandescent lamp color region of the inner side contains a mixture of a red fluorescent material and a yellow fluorescent material, and the white color region of the outer side contains a yellow fluorescent material. In the light emitting device, the electric current supplied to the incandescent light color region and the white color region are separately controlled to adjust the proportions of intensities of light of the two regions so as to adjust the color temperature.

Patent Literature 3 describes a light emitting device in which a region surrounded with a resin frame is divided in a rectangular shape by a resin dividing wall.

BACKGROUND ART LITERATURE

Patent Literature
Patent Literature 1: Japanese Unexamined Patent Application Publication No. 2010-34184
Patent Literature 2: Registered Japanese Utility Model No. 3156731
Patent Literature 3: Japanese Unexamined Patent Application Publication No. 2012-004519
Non-Patent Literature
Non-patent Literature 1: Paragon Semiconductor Lighting TechnoLogy Co., Ltd. E-Series (Web Search Date: Jun. 17, 2011, <URL:http://www.paragonLed.com/eng/series e.htmL#>)

GENERAL DESCRIPTION OF THE INVENTION

Problem to be Solved by the Invention

However, in this related art, there are problems as shown below. In the light emitting device described in Patent Literature 1, one fluorescent region is a small region sufficient to cover one light emitting element, so that emission of the light emitting element can be spread in the entire fluorescent region without having a problem. However, in the case where the number of the light emitting element is increased to obtain a light emitting device of higher output power, the area of the fluorescent material region inevitably increases, which may result in insufficient light emitting efficiency and/or insufficient distribution of brightness (luminous distribution) depending on the arrangement of the light emitting elements and the shape of separation of the fluorescent regions.

The light emitting devices according to Patent Literature 2 and Non-patent Literature 1 respectively have each region separated into an inner side and an outer side in a concentric shape. In the light emitting devices according to Patent Literature 2 and Non-patent Literature 1, two kinds of fluorescent materials are mixed in the incandescent lamp color region, so that a part of the light whose wavelength is converted by the fluorescent material of shorter wavelength side is absorbed by the fluorescent material of longer wavelength side, which may lead to a decrease in the light emitting efficiency.

In the light emitting device according to Patent Literature 3, a resin dividing wall is formed between a plurality of regions, but the resin dividing wall is colored in white or in milky white and does not have light transmissivity. Thus, due to the resin dividing wall which does not have light transmissivity, light discharged from a region of a plurality of regions is hard to mix with the light from its adjacent regions. In an illustrative embodiment where the fluorescent region is divided in two, a distance from a light emitting element disposed in one region at a position spaced apart from the other region to the other region is large, so that light emitted from the one region is difficult to be mixed with light emitted from the other region, which may result in insufficient mixing of colors of light.

Further, in a light emitting device according to Patent Literature 3, as shown in FIG. 1, the fluorescent material region is divided in two with respect to the center line of the fluorescent material region, and fluorescent material of different colors are dispersed in the respective regions. For this reason, light distribution properties differ in the right and left regions with respect to the center line, so that a preferable emission can not be obtained. Also in the illustrative embodiments of Patent Literature 3 shown in FIGS. 11 to 13, the fluorescent material regions are divided in four with respect to the center point, and in the regions 302, 303 which are point symmetrical with respect to the center point, a yellow fluorescent material or a green fluorescent material is dispersed respectively. For this reason, light distribution properties differ in the right and left regions with respect to the center point, so that a preferable emission can not be obtained.

The present invention is devised to solve the above-described problems, and an object therefore is to provide a light emitting device having a high light emitting efficiency and a good brightness distribution, further having good color mixing and good light distribution.

Means to Solve the Problem

In order to solve the above-described problems, a light emitting device according to the present invention includes a base member, a plurality of light emitting elements disposed on the base member, and a sealing member sealing the light emitting elements. The base member has a plurality of regions divided by virtual lines extending in a radial manner from one point disposed on the base member to an outer periphery of the base member, and a light transmissive wall member between adjacent two regions of the plurality of regions. A sealing member containing a fluorescent material is disposed on each region of the plurality of regions. A color tone of light emitted from a first region which is one of the two adjacent regions of the plurality of regions differs from a color tone of light emitted from a second region which is the other of the two adjacent regions. Hereinafter, a region provided with a sealing member (including a wall member) containing a fluorescent material at least a part thereof will be referred to as a fluorescent region when appropriate. Also, an emission wavelength (or simply a wavelength) of emission of a fluorescent material or a light emitting device refers to a peak wavelength. In the present invention, a "light transmissive" member having a light transmissivity with respect to light to be extracted to outside of the light emitting device of 50% or greater can be employed, and 70% or greater is preferable, 80% or greater is more preferably employed. The term "light to be extracted to outside" can be appropriately selected according to the purpose and in Embodiments 1 to 3 described below, refers to the emission of a fluorescent material and a light emitting element.

With this arrangement, the base member is divided into a plurality of regions (fluorescent regions) by virtual lines extending in a radial manner from one point disposed on the base member toward the outer periphery of the base member to have a shape so that light emitted from one light emitting element in one region can reach a greater number of fluorescent materials in the region. That is, the region does not have a surface which impedes propagation of light from a light emitting element located in the region, so that light from one light emitting element can excite a larger area of the fluorescent material in the region. This arrangement allows for all the light emitting elements in the region, in the case where light from each of the light emitting elements is overlapped, that light from each of the light emitting elements can be superimposed to create multiple layers of light. When viewed from the fluorescent material side, one fluorescent material particle is excited by a larger number of light emitting elements, thus, very high light emitting efficiency of the light emitting device can be obtained. Also, the fluorescent material regions are divided in a radial manner, so that in the case where a light transmissive wall member is used, the distance from a part of the first region which is spaced apart from the second region to other regions can be reduced by decreasing the center angles of the first region and the second region, which facilitates mixing of light emitted from a part of the first region which is spaced apart from the second region with light emitted from the second region, so that a high degree of color-mixing can be obtained.

A light emitting device according to the present invention may have, in the above-described structure, of the plurality of regions, the fluorescent material contained in the one region can be different from the fluorescent material contained in the other region. With such a structure, absorption of a part of light whose wavelength is converted by the one fluorescent material by the other fluorescent material can be prevented, so that degradation of light emitting efficiency can be prevented. Also, inclusion of different fluorescent materials in one region and in the other region allows obtaining of different color tones of the light emitted from the one region and of the light emitted from the other region.

Also, in a light emitting device according to the present invention, in the structure described above, the fluorescent material includes a first fluorescent material for absorbing at least a part of light from the light emitting elements and emitting light with a longer wavelength than a wavelength of the light from the light emitting elements, and a second fluorescent material for absorbing at least a part of light from the light emitting elements and emitting light with a longer wavelength than both the wavelength of the light from the light emitting elements and the wavelength of the light from the first fluorescent material, and a ratio of a total area of the first region containing the first fluorescent material and a total area of the second region containing the second fluorescent material is 2:3 to 3:2. With such a structure described above, the ratio of the total area of the first region containing the first fluorescent material and the total area of the second region containing the second fluorescent material is 2:3 to 3:2, so that light of good color rendering properties can be emitted.

A light emitting device according to the present invention has, in the structure described above, the one point on the base member is the center of the base member. With such a structure, a plurality of regions is divided in a radial manner with respect to the center point of the base member, which facilitates substantially aligning the center of emission of the light emitting device with the center of the base member.

Also, a light emitting device according to the present invention includes, in the structure described above, the plurality of regions having the same center angle centering on one point on the base member. Particularly, the center angle is preferably 90°. With the structure as described above having the same center angles, manufacturing the light emitting devices can be facilitated and mass productivity can be improved.

A light emitting device according to the present invention preferably has, in the structure described above, a plurality of at least one of the first region or the second region, and the plurality of the first regions with each other or the plurality of the second regions with each other are at locations 180° rotated around the one point on the base member as the center point. With the structure as described above, luminance distribution (light intensity distribution) can be close to uniform, and further, good optical orientation characteristics can be obtained. Further, it is preferable that a plurality of the first regions and the second regions are included, and a group of the plurality of the first regions with each other and the second regions with each other are at locations rotated 180° around the one point of the base member as a center point.

It is preferable that in addition to the structure described above, a light emitting device according to the present invention further includes a light reflecting member disposed at the outer periphery of the base member so as to surround the sealing member. With this structure, because it is surrounded by the light reflecting member, a sealing material which is a raw material for the sealing member can be applied easily to the fluorescent material region on the base member. Also, because it is surrounded by the light reflecting member, the light extraction efficiency of the light emitting device can be improved.

It is preferable that in addition to the structure described above, a light emitting device according to the present invention further includes one or a plurality of second light emitting elements in the wall member. With such a structure, the second light emitting element can be disposed without providing a new region for disposing the second light emitting element, so that an increase in the size of the light emitting device can be prevented. In the case where a light emitting element to emit light of a different wavelength than the emission wavelength of the light emitting element and the fluorescent material is used as the second light emitting element, the light of the wavelength region can be compensated by the light from the second light emitting element.

Also, a light emitting device according to the present invention preferably includes, in the structure described above, the wall member which does not contain a fluorescent material. With such a structure, the wall member does not contain a fluorescent material, so that light within the wall member is not scattered by the fluorescent material in the wall member, and thus, light in the wall member can be extracted efficiently.

Also, a light emitting device according to the present invention with such a structure as described above, the light emitted from the light emitting element and passes through the sealing member without being absorbed by the first fluorescent material and the second fluorescent material, the light from the first fluorescent material, and the light from the second fluorescent material are mixed and emitted as a white light. With such a structure as described above, a white light emitting device of high light emitting efficiency can be provided.

Also, a light emitting device according to the present invention, in the structure described above, preferably emits light having a wavelength between the wavelength of the light from the light emitting element and the wavelength of the light from the first fluorescent material. With such a structure, the second light emitting element emits light between the wavelength of the light from the light emitting element and the wavelength of the light from the first fluorescent material, so that the light in the missing wavelength region can be compensated. In the case where the light emitting device emits a white light, accordingly, a white light of high color rendering properties can be obtained.

In a light emitting device according to the present invention, in a particularly preferable embodiment, the light emitting element is a light emitting element capable for emitting a blue light, and the first fluorescent material is a fluorescent material capable for emitting a yellow light, and the second fluorescent material is a fluorescent material capable for emitting a red light. With such a structure, a blue light from the blue light emitting element, a yellow light from the yellow fluorescent material, and a red light from the red fluorescent material are mixed well, so that the light emitting device capable for emitting a white light of high color rendering properties can be provided.

In a light emitting device according to the present invention, in a particularly preferable embodiment, the second light emitting element is a light emitting element capable for emitting a blue-green light. With such a structure, in the case where the light emitting element is a light emitting element capable for emitting a blue light, the first fluorescent material is a fluorescent material capable for emitting a yellow light, and the second fluorescent material is a fluorescent material capable for emitting a red light, employing the second light emitting element capable for emitting a blue-green light allows good compensation of light in the missing wavelength range, and the white light emitting device of high color rendering properties can be provided.

Also, a light emitting device according to the present invention, in the structure described above, a plurality of the light emitting elements are disposed respectively in the first regions and the second regions. The structures of the light emitting device according to the present invention are particularly suitable in the case where a plurality of light emitting elements are disposed in the respective regions.

Also, a light emitting device according to the present invention is characterized in that, in the structure described above, at least a part of the light emitting elements and at least a part of the second light emitting elements are connected in series. With such a structure, the light emitting elements and the second light emitting elements are connected in series, so that the electric current supplied to the light emitting elements and the second light emitting elements which are connected in series can become a uniform flow, and thus approximately the same amount of current flow can be supplied to the light emitting elements and the second light emitting elements. Accordingly, approximately the same optical output power can be obtained.

Also, a light emitting device according to the present invention is characterized in that, in the structure described above, at least a part of the light emitting elements disposed in the first region and at least a part of the second light emitting elements disposed in the second region are connected in series. With such a structure, the light emitting elements disposed in two adjacent regions are connected in series so that the electric current flows to the light emitting elements connected in series can be made uniform, thus, approximately the same amount of electric current flow can be supplied to the light emitting elements. Accordingly, approximately the same optical output power can be obtained.

It is preferable that in addition to the structure described above, a light emitting device according to the present invention further includes a light-transmissive member covering the sealing member. With such a structure, which further includes a light-transmissive member, irregularity in emission color of the light emitting device as a whole, particularly the outer peripheral portion of the light emitting device can be improved.

Effect of the Invention

According to the present invention, a light emitting device having a high light emitting efficiency and a good brightness distribution, further having a good color mixing and a good light distribution can be provided.

DETAILED DESCRIPTION OF THE EMBODIMENTS

Figure 1:
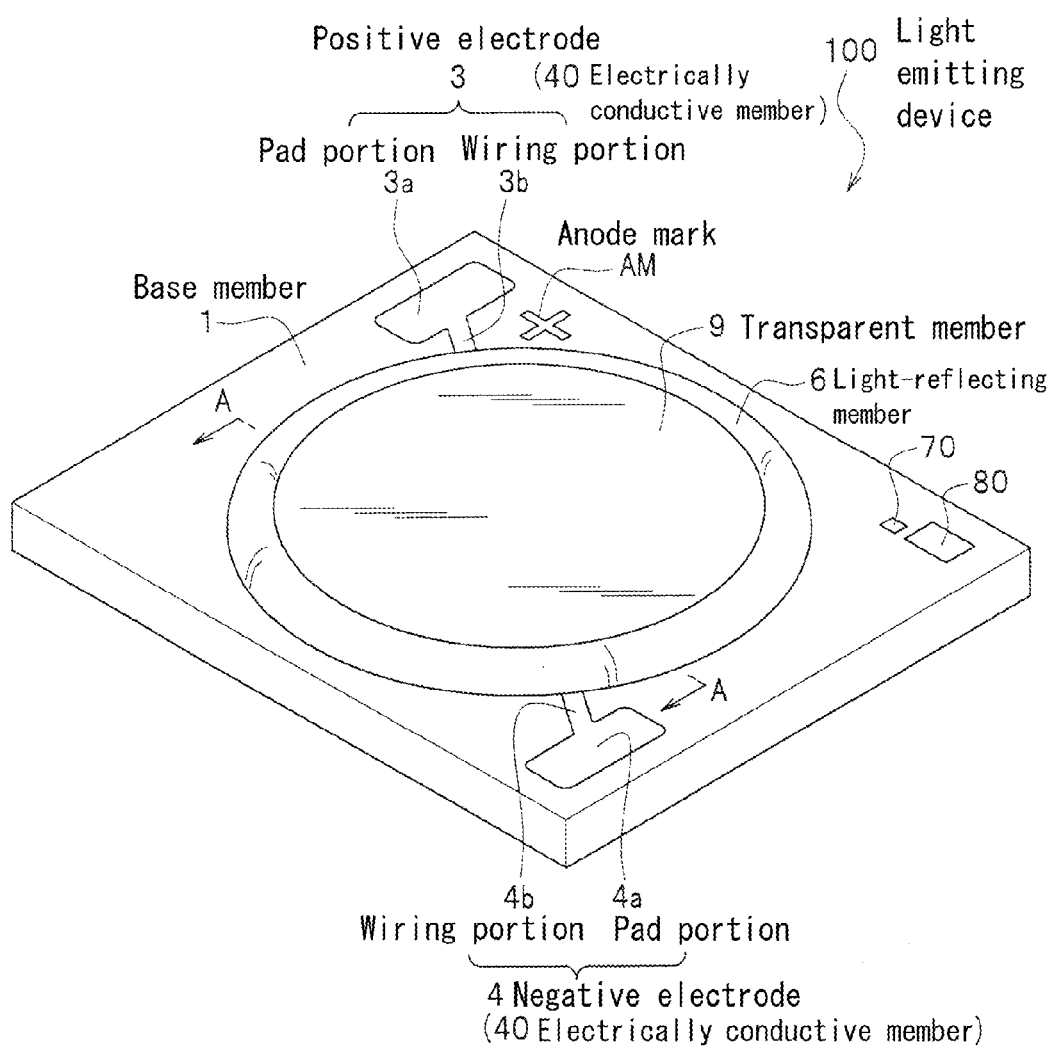
FIG. 1 is a perspective view showing an overall structure of a light emitting device according to Embodiment 1 of the present invention.

A light emitting device according to embodiments of the present invention will be described below with reference to the accompanying drawings. In the drawings, the size and the positional relationship of the components may be exaggerated for clarity. Further, in the description below, identical members or members of the same quality are assigned the same names and reference numerals and detailed description thereof will be appropriately omitted.

Figure 2:
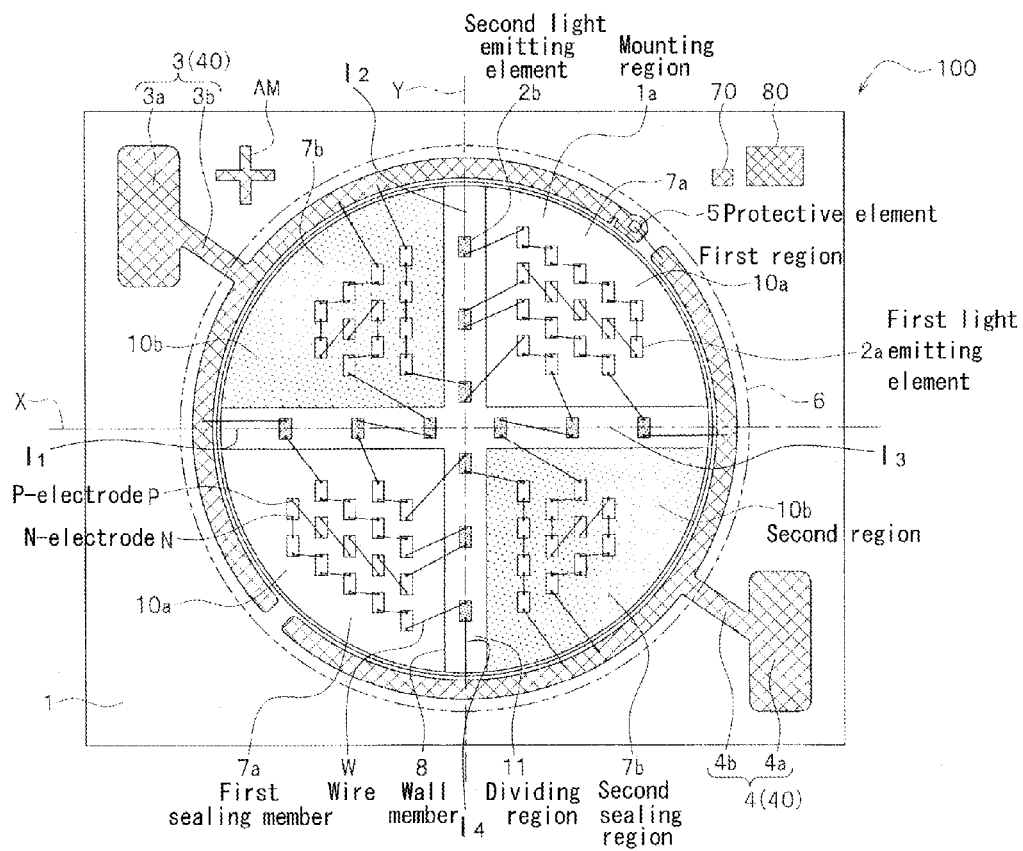
FIG. 2 is a top view showing a structure of a light emitting device according to Embodiment 1 of the present invention.

In FIG. 2 referred to below, for the sake of illustration, a transparent member 9 is omitted, and the light reflecting member 6 is shown only by the outline with the alternate long and two short dashed lines. Also, in the first regions 10a, the second regions 10b, and the dividing region 11, the light emitting elements 2a, 2b, and the wires Ware shown in the figure so as to illustrate the arrangements and connection relationship of the light emitting elements (the first light emitting elements 2a and the second light emitting elements 2b, which, hereinafter may be referred to as the light emitting elements 2a, 2b). Further, the description is given assuming all the light emitting elements 2a, 2b are arranged in the same orientation, and in a plan view of the figure, the p-electrodes (P) are disposed at the upper side (+ (plus) side) and the n-electrodes (N) are disposed at the lower side (− (minus) side).

A light emitting device 100 according to an embodiment of the present invention includes a base member 1, a plurality of light emitting elements (first light emitting elements 2a) disposed on a mounting region 1a of the base member 1, and a sealing member (first sealing member 7a, second sealing member 7b) sealing the light emitting elements (first light emitting elements 2a). The base member 1 has a plurality of regions (first regions 10a, second regions 10b) divided by virtual lines extending in a radial manner from one point (preferably the center (center of gravity) of the base member) on the base member to an outer periphery of the base member, and a light transmissive wall member 8 between adjacent two regions (that is between the first region 10a and the second region 10b) of the plurality of regions. A sealing member (first sealing member 7a, second sealing member 7b) containing a fluorescent material is disposed on each region of the plurality of regions respectively. A color tone of light emitted from one region (for example a first region 10a) which is one of the two adjacent regions of the plurality of regions differs from a color tone of light emitted from the other region (for example a second region 10b) which is the other of the two adjacent regions. Different color tones in the light emitted from the one region and in the light emitted from the other region may be obtained by including different fluorescent materials in one region and in the other region. In Embodiment 1, the case where the base member is divided in four regions will be described in detail.

Embodiment 1

Light Emitting Device

A light emitting device 100 according to Embodiment 1 of the present invention will be described in detail with reference to FIGS. 1 to 3. In the description below, an overall structure of the light emitting device 100 will be described and then each structure will be described.

Overall Structure

The light emitting device 100 is, for example, used for lighting luminaire such as an LED bulb, a spotlight. The light emitting device 100, in the present embodiment, mainly includes as shown in FIGS. 1 to 3, a base member 1, a plurality of light emitting elements 2a, 2b, arranged in a mounting region 1a on the base member 1, an electrically conductive member 40 constituting a positive terminal 3 and a negative terminal 4 disposed on the base member 1, a protective member 5 arranged on the positive terminal 3, wires W respectively connect the electrical components such as the light emitting elements 2a, 2b and the protective member 5 with the positive terminal 3 and the negative terminal 4, a light-reflecting member 6 formed on the base member 1, sealing members (first sealing member 7a and second sealing member 7b: when appropriate, hereinafter may be called sealing members 7a, 7b) which cover the light emitting element 2a, a wall member 8 which covers the light emitting element 2b, and a transparent member 9 formed on the mounting region 1a. Also in the embodiment, as shown in FIG. 2, the fluorescent material region is divided in four in a radial manner by forming a wall member 8 in a dividing region 11. That is, the wall member 8 is formed centering the center point (center of gravity) of the base member 1, along an imaginary line $I_1$ extending along a first direction (for example, in a direction extending leftward from the origin of X-axis (center point of the base member 1) along the X-axis, along an imaginary line $I_2$ extending along a second direction which is 90° rotated clockwise with respect to the first direction, along an imaginary line $I_3$ extending along a third direction which is 180° rotated clockwise with respect to the first direction, and along an imaginary line $I_4$ extending along a fourth direction which is 270° rotated clockwise with respect to the first direction. Thus, the fluorescent material region is divided in four fan-shaped regions by the wall member 8 formed as described above. The base member is divided in a radial manner from the center of the base member, which facilitates fabrication of the light emitting device. Also, the base member is divided in a radial manner from the center of the base member, which facilitates mixing of light. The four fan-shaped regions are made up of a first region 10a which is a region provided with the first sealing member 7a and a second region 10b which is a region provided with a second sealing member 7b, and two of each of the first region 10a and the second region 10b are included. Then, as shown in FIG. 2, the first region 10a and the second region 10b are alternately arranged. In this arrangement, the first light emitting elements 2a of the same kind are arranged in the first regions 10a and the second regions 10b. The center angle (that is, an angle formed by two sides passing through the center of the base member) of the first region 10a and the second region 10b may be the same, and particularly, 90° is preferable. With the structure as described above, fabrication of the light emitting device can be facilitated and mass productivity can be improved. Also, in the dividing region 11 where the wall member 8 is formed, the second light emitting elements 2b are arranged and covered with the wall member 8. But in the dividing region 11, the second light emitting elements 2b are not necessarily arranged. In the case where the second light emitting elements 2b are arranged in the wall member 8, the wavelength of light emitted from the second light emitting elements is configured to be between the wavelength of light from the light emitting elements and the wavelength of light emitted from the first fluorescent material of the second fluorescent material, so that light of wavelength which is not included in the spectrum of light from the light emitting device 100 can be compensated. Accordingly, the color rendering properties can be improved.

Also, the first regions or the second regions are preferably at the locations 180° rotated centering the center of the base member. With such a structure, in a cross-sectional plane passing through the center of the base member, the regions of a same fluorescent material can be arranged symmetrically with respect to the center. Also, in the cross-sectional plane passing through the center of the base member and between the first region and the second region (location of the wall member), light from the first region and light from the second region are mixed approximately evenly in a symmetrical manner with respect to the center. With the structure as described above, luminance distribution (light intensity distribution) can be close to uniform, and further, good optical orientation characteristics can be obtained.

Base Member

The base member 1 is for arranging the electrical components such as the light emitting elements 2a, 2b and the protective element 5. The base member 1 can be formed in a planar rectangular shape, as shown in FIG. 1 and FIG. 2. Also, on the base member 1, as shown in FIG. 2, a mounting region 1a for arranging a plurality of light emitting elements 2a, 2b is divided. The size and the shape of the base member 1 are not specifically limited and appropriately selected according to the number and arrangement interval of the light emitting elements 2a, 2b etc., and aim and application. In an example, 16 mm×19 mm is employed.

As the material for the base member 1, an insulating material is preferably used, which does not facilitate propagation of light discharged from the light emitting elements 2a, 2b and external light is preferably used. In addition, a material having a certain degree of strength is preferably used. More specifically, ceramics or a resin can be employed. Also, a member having an insulation layer disposed on a surface of a metal can also be used as the material for the base member 1.

Mounting Region

The mounting region 1a is a region for arranging a plurality of light emitting elements 2a, 2b. The mounting region 1a is as shown in FIG. 2, provided in a center region of the base member 1 and formed in a circular shape. In the embodiment, the sealing members 7a, 7b, and the outermost frame of the wall member 8, that is, the inner edge of the light reflecting member 6 serves as the outer frame of the mounting region 1a. The size and the shape of the base member 1a are not specifically limited and appropriately selected according to the number and arrangement interval of the light emitting elements 2a, 2b etc., and aim and application.

The mounting region 1a may be made with a same material as the base member 1, but for example, it is preferable that a metal layer to reflect light is formed on the mounting region 1a and a plurality of light emitting elements 2a, 2b are arranged on the metal layer through the metal layer. Thus, forming a metal layer on the mounting region 1a and arranging a plurality of light emitting elements 2a, 2b thereon allows light travelling toward the mounting region 1a side of the base member 1 can also be reflected by the metal layer. Accordingly, loss of emission can be decreased and the light extracting efficiency of the light emitting device 100 can be improved. The material of the metal layer is not specifically limited, but for example, Ag (silver) or Au (gold) is preferably used, and particularly, Ag is preferably used. Au has a property that tends to absorb light, but further forming a layer of high reflectance such as a layer made of $TiO_2$ particles on, for example, the surface of the Au plating allows enhancing the light reflectance. Also, Ag has a higher light reflectance to visible light than Au, so that the light extraction efficiency of the light emitting device 100 can be more improved than applying a plating using only Au. The thickness of the metal layer formed on the mounting region 1a is not specifically limited and appropriately selected according to aim and application.

Light Emitting Element

The light emitting elements 2a, 2b are semiconductor elements which emits light upon application of voltage. The light emitting elements 2a, 2b are, as shown in FIG. 2, arranged on the mounting region 1a of the base member 1 in plural so that the plurality of light emitting elements 2a, 2b integrally to form an emission portion of the light emitting device 100, that is the portion to perform emission. More specifically, in the embodiment, a plurality of the first light emitting elements 2a are arranged respectively in the two first regions 10a, 10a to constitute the emission portion of the first regions 10a, 10b. Also, in the two second regions 10b, 10b, a plurality of the first light emitting elements 2a are arranged respectively to constitute light emitting portions of the second regions 10b, 10b. Further, in the embodiment, in the dividing region 11, the second light emitting elements 2b are arranged in plural to constitute the light emitting portion of the dividing region 11.

Each of the light emitting elements 2a, 2b can be formed in a rectangular shape as shown in FIG. 2. The light emitting elements 2a, 2b are face-up (FU) elements in which a p-electrode (P) is disposed on a – (minus) side of the upper surfaces of the elements and an n-electrode (N) is disposed on the other side of the light emitting elements 2a, 2b respectively.

For the light emitting elements 2a, 2b, more specifically, a light emitting diode is preferably used and according to the application, an appropriate wavelength can be selected. For example, for blue-green (light of wavelength 430 nm to 570 nm) light emitting elements 2a, 2b, a nitride-based semiconductor ($In_XAl_YGa_{1-X-Y}N$, $0 \leq Y$, $X+Y \leq 1$) etc., can be used. For red (light of wavelength 620 nm to 750 nm) light emitting elements 2a, 2b, GaAlAs, AlInGaP etc., can be used.

For example, for the first light emitting elements 2a, blue light emitting elements (light of wavelength 430 nm to 490 nm) can be used, for the second light emitting elements 2b, light emitting elements having a wavelength different from the emission wavelength of the first fluorescent material and the second fluorescent material, or the wavelength of the first light emitting elements 2a, for example, a light emitting element (for example, blue-green (light of a wavelength 490 nm to 520 nm)) with a wavelength which can improve the color rendering properties of the light emitting device can be used. For such second light emitting elements 2b, light emitting elements having an emission wavelength between the first fluorescent material and the second fluorescent material and an emission wavelength of the first light emitting elements 2a are preferably used. With this arrangement, light of a wavelength between the first fluorescent material and the second fluorescent material and the emission wavelength of the first light emitting elements 2a can be compensated by the second light emitting elements 2b. Accordingly, a light emitting device having a high color rendering properties can be provided.

The composition, emission color, size, or the like of the light emitting elements 2a, 2b are not limited to those described above and can be selected appropriately according to the purposes. For the light emitting elements 2a, 2b, not only the elements which emit light in visible region but also the elements which emit ultraviolet rays or infrared rays can be employed. In order to obtain high output power, the total number of the light emitting elements 2a, 2b is set to, for example, 10 or more, and preferably in a range of 20 to 400.

Arrangement of Light Emitting Elements

A plurality of light emitting elements 2a are arranged in each of the plurality of first regions 10a, and a plurality of light emitting elements 2a are arranged in each of the plurality of second regions 10b. More specifically, as shown in FIG. 2, the first light emitting elements 2a are arranged in the two first regions 10a, 10a and the second regions 10b, 10b. Also, in the dividing region 11, the second light emitting elements 2b are arranged. The first light emitting elements 2a are, as shown in FIG. 2, arranged on the base member 1 with predetermined intervals in a longitudinal direction and in a lateral direction, and in FIG. 2, 16 elements in each of the two first regions 10a, 10a, 12 elements in each of the two second regions 10b, 10b, a total of 56 elements are arranged in a zigzag manner. Herein, the term "arranged in a zigzag manner" refers an arrangement in a longitudinal direction and a lateral direction respectively with a predetermined intervals (arrangement in a matrix), an arrangement with a shift in every second line in a longitudinal direction, or an arrangement with a shift in every second row in a lateral direction. With a zigzag arrangement, a distance between adjacent light emitting elements can be increased compared to the case of a matrix arrangement, so that emission of the light emitting elements can be prevented from being absorbed by the adjacent light emitting elements. The second light emitting elements 2b are, as shown in FIG. 2, on the base member 1, arranged in one row in a longitudinal direction and one row in a lateral direction, that is, arranged in a cross shape at predetermined intervals respectively, and in the embodiment, a total of 12 elements are arranged.

Also, as shown in FIG. 2, the light emitting elements 2a, 2b are arranged on the base member 1 in longitudinal rows and lateral rows and adjacent light emitting elements are electrically connected in series by electrically conductive wires W. Herein, the expression "connected in series" indicates a state in which the p-electrode (P) and the n-electrode (N) of adjacent light emitting elements are electrically connected by electrically conductive wires W. The expression "connected in parallel" to be described below indicates a state in which the p-electrode (P) and the n-electrode (N) of adjacent light emitting elements are electrically connected by the wires W and the electrically conductive members 40.

At least a part of the first light emitting elements 2a which are the light emitting elements of the first region 10a and the second region 10b and the second light emitting elements 2b which are the light emitting elements of the dividing region 11 are preferably connected in series. In the embodiment, as shown in FIG. 2, the p-electrode (P) or the n-electrode (N) of the second light emitting elements 2b on the dividing region 11 are connected in series to the p-electrode (P) or the n-electrode (N) of the adjacent first light emitting elements 2a by the wires (W).

In the case where the element of different forward drop voltage (hereinafter referred to as $V_f$) are arranged in one row, the optical output changes due to an irregular $V_f$ of the light emitting elements, irregularity in brightness (irregularity in emission) may occur in the light emitting device and further, a difference in distribution of brightness (luminance distribution) among a plurality of light emitting devices may be generated. However, connecting the light emitting elements in series can prevent occurrence of irregularity in brightness or difference in distribution of brightness. Herein, the term "$V_f$" means a voltage necessary to supply forward current to a light emitting element (a light emitting diode), that is, the voltage necessary for the light emitting element to emit light. For example, in the case where a light emitting element of high $V_f$ and a light emitting element of low $V_f$ are connected in parallel, larger amount of electric current flows to the light emitting element of low $V_f$.

That is, connecting the light emitting elements in series allows uniform current flow to each of the light emitting elements. For example, in the case where a light emitting element of high $V_f$ and a light emitting element of low $V_f$ are connected in parallel, larger amount of electric current flows to the light emitting element of low $V_f$, but with series connection, appropriately a same amount of current flows to both the light emitting elements. Thus, even in the case where a plurality of light emitting elements of different $V_f$ are used, the electric current flows to each light emitting element can be uniform with series connection, so that emission of approximately a same intensity can be obtained from each light emitting element. Particularly, the first light emitting elements 2a and the second light emitting elements 2b of different emission wavelengths tend to have different $V_f$ values. Connecting them in series allows obtaining of emission of approximately uniform intensity and thus irregularity in brightness of the light emitting device 100 can be reduced. For a similar reason, at least a part of the first light emitting elements 2a of the first region 10a and at least a part of the first light emitting elements 2a of the second region 10b are preferably connected in series. The first light emitting elements 2a of the first region 10a and the first light emitting elements 2a of the second region 10b and the second light emitting elements 2b may be connected in series. In the light emitting device 100 shown in FIG. 2, a plurality of groups of the first light emitting elements 2a and the second light emitting elements 2b connected in series are disposed and connected in parallel. The number of the light emitting elements of the groups is preferably the same. In the case where the total number of the light emitting elements is small, all the light emitting elements may be connected in series. Further, to the series circuit as described above, for example, the light emitting elements which are adjacent to each other are connected in parallel, and the group is regarded as one light emitting element. Thus, such groups are connected in series to form so called a ladder-shape wiring (ladder), so that light emitting devices which can be adopted to various power sources can be obtained. There may be cases in which the first light emitting elements 2a and the second light emitting elements 2b differ in the material and/or size, so that appropriately a same degree of light emitting intensity can not be obtained even uniform electric current is supplied. For the reasons described above, the first light emitting elements 2a and the second light emitting elements 2b are preferably made with equivalent material, planar dimension, and shape. For example, same GaN-based semiconductor light emitting elements with different emission wavelengths are used. The first light emitting element 2a and the second light emitting element 2b are preferably selected as a combination of light emitting elements with close emission wavelengths, for example, a combination of blue (light of wavelength 430 nm to 490 nm) and blue-green (light of wavelength 490 nm to 520 nm), a combination of blue (light of wavelength 430 nm to 490 nm) and green (light of wavelength 520 nm to 570 nm) can be employed.

The wires W can be disposed according to the purpose, and preferably, a same number of the light emitting elements are connected in series which are then connected in parallel. For example, as shown in FIG. 2, 17 light emitting elements are connected in series and four of those connected in series are connected in parallel. Further preferably, in all the series connections which are connected in parallel, a same number of the first light emitting elements 2a (for example blue light emitting elements) and the second light emitting elements (for example blue-green light emitting elements) are connected in series. For example as shown in FIG. 2, in all four serial connections, 14 blue light emitting elements and 3 blue-green light emitting elements are connected in series. Also, as to be described below, the size of the first regions 10a and the second regions 10b can be changed by changing the width of the wall member 8 to a suitable size for accommodating each number of the light emitting elements in each region, but as shown in FIG. 2, in the case where the difference in the number of the light emitting elements in the first regions 10a and the second regions 10b are not so much, the width of the wall member 8 is not needed to change.

Also, the first light emitting elements 2a in each region preferably have approximate properties such as size, output power, wavelength etc. Changing the planar dimension and the number of light emitting elements 2a allows changing of the emission intensity in each region. With this arrangement, the proportion of intensities of light emission of the first regions 10a and the second regions 10b can be adjusted and a desired color tone can be obtained. For example, yellow hue can be enhanced by increasing the light emission of yellow fluorescent material region.

Electrically Conductive Member (Positive Electrode and Negative Electrode)

The electrically conductive member 40 is for constituting the positive terminal 3 and the negative terminal 4, and serves to electrically connect the electric components such as a plurality of light emitting elements 2a, 2b and the protective element 5 etc. on the base member 1 with an external power source to apply voltage from the external power source to those electric components. That is, the electrically conductive members 40 (positive terminal 3 and negative terminal 4) serve as the electrodes which allows supply of electricity from outside or serve a part thereof.

The positive terminal 3 and the negative terminal 4 include, as shown in FIG. 2, a pad portion (current feeder portion) 3a, 4a having an approximately rectangular shape and wiring portion 3b, 4b in a line shape and the pad portion 3a, 4a and the wiring portion 3b, 4b are connected. The voltage applied to the pad portions 3a, 4a is configured to be applied to the light emitting portion made up of a plurality of light emitting elements 2a, 2b through the wiring portions 3b, 4b. The pad portions 3a, 4a are for applying voltage from an external power source. Pad portions 3a, 4a are, as shown in FIG. 2, formed as a pair on the base member 1 at locations symmetrical with respect to the center point (point of gravity) of the base member 1. Then, the pad portions 3a, 4a are, for example by electrically conductive wires, electrically connected to an external power source which is not shown.

The wiring portions 3b, 4b serve to conduct voltage applied from an external power source to the pad portions 3a, 4a to the light emitting elements 2a, 2b on the mounting region 1a. The wiring portions 3b, 4b are, as shown in FIG. 2, formed extending from the pad portions 3a, 4a and also along the periphery of the mounting region 1a to have an appropriately circular shape.

For the material of the electrically conductive member 40 which constitutes the positive terminal 3 and the negative terminal 4, Au is preferably used. This is because, as described below, in the case where Au having an improved thermal conductive property is used as the material of the wire W, a firm bonding can be obtained with the wire W which is made of the same material. The symbol AM refers to an anode mark indicating the pad portion 3a being a positive terminal 3. The symbol 70 refers to a position mark indicating the bonding positions of the light emitting elements 2a, 2b. The symbol 80 refers to a temperature measure point of the light emitting device 100. The same material in the positive terminal 3 and the negative terminal 4 can be used for those portions and other electrically conductive portions.

Protective Element

The protective element 5 is an element for protecting the light emitting portion made with a plurality of light emitting elements 2a, 2b from destruction of element and deterioration of performance due to excessive application of voltage. The protective element 5 is, as shown in FIG. 2, arranged at an end portion of the wiring portion 3b of the positive terminal 3. The protective element 5 may be arranged at an end portion of the wiring portion 4b of the negative terminal 4.

The protective element 5 is, more specifically, constituted with a Zener Diode which is in the conducting state with application of a voltage greater than a predetermined voltage. The protective element 5 is, although not shown, a semiconductor element having a p-electrode (P) and an n-electrode (N) in a same manner as in the above-described light emitting elements 2a, 2b, and is electrically connected to the wiring portion 4b of the negative electrode 4 with the wire W in an inverse-parallel connection (that is, the p-electrodes (P) of the light emitting elements 2a, 2b and the n-electrode of the protective element 5 are electrically connected and the n-electrodes (N) of the light emitting elements 2a, 2b and the p-electrode of the protective element 5 are electrically connected) with respect to the p-electrodes (P) and the n-electrodes (N) of the light emitting elements 2a, 2b.

The protective element 5 is, as shown in FIG. 2, covered with the light-reflecting member 6 to be described below. Thus, the wires W connected to the protective element 5 and the protective element 5 are protected from dust, moisture, an external force etc.

Light Reflecting Member

The light-reflecting member 6 serves to reflect light emitted from the light emitting elements 2a, 2b and does not have light transmissive property. The light-reflecting member 6 is, as shown in FIG. 2, formed to cover a part of the wiring portions 3b, 4b, the protective element 5, and the wire W which is connected to the protective element 5. Accordingly, even in the case where the wiring portions 3b, 4b and the wire W are made of Au which tends to absorb light as described above, light emitted from the light emitting elements 2a, 2b is reflected by the light-reflecting member 6 before reaching the wiring portions 3b, 4b and the wires W. Accordingly, loss of emission can be decreased and the light extracting efficiency of the light emitting device 100 can be improved. Further, a part of the wiring portions 3b, 4b, and the protective element 5 and the wires W connected to the protective element 5 are covered with the light-reflecting member 6, so that the part of the wiring portions 3b, 4b, and the protective element 5 and the wires W connected to the protective element 5 can be protected from dust, moisture, an external force etc.

The light-reflecting member 6 is, as shown in FIG. 1 and FIG. 2, formed in a circular shape to surround the mounting region 1a on the base member 1. With the light-reflecting member 6 formed to surround the circumference of the mounting member 1a as described above, light travelling toward the circumference (outer side) of the mounting region 1a can be reflected by the light-reflecting member 6a. Accordingly, loss of emission can be decreased and the light extracting efficiency of the light emitting device 100 can be improved.

Also, the light-reflecting member 6 is, as shown in FIG. 2, preferably formed to cover a part of the circumference of the mounting region 1a. As described above, disposing the light-reflecting member 6 to cover a part of the circumference of the mounting region 1a allows elimination of regions between the wiring portions 3b, 4b and the mounting region 1a where the base member 1 is exposed. Accordingly, all the light emitted from the light emitting elements 2a, 2b toward the inner region with respect to the portion where the light-reflecting member 6 is disposed can be reflected by the light-reflecting member 6, so that loss of emission can be decreased the most, so that the light extracting efficiency of the light emitting device 100 can be improved. The light-reflecting member 6 is formed higher than the light emitting elements 2a, 2b.

For the material of the light-reflecting member 6, an insulating material is preferably used. In order to secure a certain degree of strength, for example, a thermosetting resin, a thermoplastic resin, etc., can be used. Specific examples thereof include a phenol resin, an epoxy resin, a BT resin, PPA, and a silicone resin. Light can be efficiently reflected by dispersing powder of a reflecting member (for example $TiO_2$, $Al_2O_3$, $ZrO_2$, MgO) etc., which absorbs little light emitted from the light emitting elements 2a, 2b and has a large difference in the refractive index to a resin of those described above used as a parent material. The size of the light-reflecting member 6 is not specifically limited, and can be selected appropriately according to the aim and application.

In the case where a resin is used for the material of the light-reflecting member 6, curing of the resin can be performed before disposing the sealing member 7a, 7b and concurrently with curing of the wall member 8, or may be performed after disposing the sealing member 7a, 7b or forming the transparent member 9, concurrently with curing of the sealing member 7a, 7b or the transparent member 9. In this case, the term "forming" refers to a state before curing, and for example, the expression "forming the wall member 8" refers to simply shaping the wall member 8 which does not involve curing of the wall member 8. A resin discharge device can be used for formation of the light-reflecting member 6.

Sealing Member

The sealing member 7a, 7b contains a fluorescent material and serves to protect the light emitting elements 2a, 2b and the wires W arranged on the base member 1 from dust, moisture, an external force etc. The sealing member 7a, 7b includes a first sealing member 7a which contains a first fluorescent material and provides a plurality of first regions 10a on the base member 1 and a second sealing member 7b which contains a second fluorescent material which has an emission wavelength different from the emission wavelength of the first fluorescent material and provides a plurality of second regions 10b on the base member 1. For example, the emission wavelength of the first fluorescent material may be shorter than the emission wavelength of the second fluorescent material, more specifically, the first fluorescent material is a yellow fluorescent material and the second fluorescent material is a red fluorescent material. In this case, using a blue light emitting element as the first light emitting element 2a, a blue light from the blue light emitting element, a yellow light from the yellow fluorescent material, and a red light from the red fluorescent material are mixed well, so that the light emitting device to emit a white light of high color rendering properties can be provided.

The first sealing member 7a covers a plurality of first light emitting elements 2a at each portion where a plurality of the first regions 10a, 10a are formed. The second sealing member 7b covers a plurality of second light emitting elements 2a at each portion where a plurality of the second regions 10b, 10b are formed. As described above, by separating into the first region 10a and the second region 10b, absorption of the emission of the first fluorescent material (for example, a yellow fluorescent material) by the second fluorescent material (for example a red fluorescent material) can be prevented.

In the light emitting device according to Embodiment 1, the ratio of the total planar dimension of the first regions 10a which contains the first fluorescent material to the total planar dimension of the second region 10b which contains the second fluorescent material is preferably 2:3 to 3:2. With the ratio of the total planar dimension of the first regions 10a which contains the first fluorescent material to the total planar dimension of the second region 10b which contains the second fluorescent material being 2:3 to 3:2, an extreme difference in emission intensity between the first regions 10a and the second regions 10b hardly occurs, so that approximately uniform brightness distribution can be obtained. The ratio shown above is particularly suitable to the case where a red fluorescent material (for example CASN, SCASN) is used for the second fluorescent material and a yellow fluorescent material (for example YAG) is used for the first fluorescent material to obtain a white light. That is, in a conventional light emitting device in which such a first fluorescent material is mixed in one region, a white light can be obtained with a smaller amount of the second fluorescent material compared to the amount of the first fluorescent material. But in the light emitting device according to Embodiment 1 of the present invention in which the first fluorescent material and the second fluorescent material are disposed in different regions, a far greater amount of the second fluorescent material is needed to obtain a white light equivalent to the conventional light emitting device. This is considered that in the conventional light emitting devices, apart of emission of the first fluorescent material is absorbed and wavelength-converted by the second fluorescent material, so that the wavelength-converted light to be extracted from the light emitting device is balanced by a small amount of the second fluorescent material and a large amount of the first fluorescent material, but with an arrangement in which the first fluorescent material and the second fluorescent material are arranged in different regions, while absorption of the emission of the first fluorescent material by the second fluorescent material is suppressed, the amount of the wavelength-converted light by the second fluorescent material is decreased in a relative manner. Accordingly, in order to obtain a white light by the light emitting device according to Embodiment 1 as described above, the ratio of the total planar dimension of the first fluorescent material region 10a which contains the first fluorescent material and the total planar dimension of the second fluorescent material region 10b which contains the second fluorescent material is preferably set as described above. Further, approximately the same (preferably 1:1) facilitates productivity and thus preferable.

For the material of the sealing members 7a, 7b, a material having light transmissivity which allows light from the light emitting elements 2a, 2b to pass through is preferable. Examples of the material include a silicone resin, an epoxy resin, and a urea resin. In addition to above-described materials, a coloring agent, a light diffusing material, a filler or the like, can be included as needed.

The sealing members 7a, 7b can be formed with a single member or with two or more of a plurality of layers. Also the filling amount of the sealing members 7a, 7b which is sufficient to cover the light emitting elements 2a, 2b, the wires W etc., is needed. In the case where the sealing members 7a, 7b to serve as a lens, the surfaces of the sealing members 7a, 7b may be mounded to form a lamp shape or a convex lens shape.

Curing of the first sealing member 7a and the second sealing member 7b can be performed concurrently or separately. For example, in the case where the first sealing members 7a and the second sealing members 7b are adjacently disposed (adhered), the first sealing member 7a and the second sealing member 7b are cured at the same time to integrate those members, so that a structure in which the members are difficult to detach from each other can be obtained.

Arrangement of First Region and Second Region

As shown in FIG. 2, in the present embodiment, a plurality of the first regions 10a and a plurality of the second regions 10b are divided in four in a radial manner, and in a plan view, arranged rotationally symmetric to the center of the mounting region 1a. Preferably formed with rotational symmetry so that when rotated 180° centering the center of the mounting region 1a, the first regions 10a and the second regions 10b respectively approximately overlap with each other. The first regions 10a and the second regions 10b are preferably arranged at uniform intervals. In the embodiment, the fluorescent material region made up of a plurality of the first regions 10a and a plurality of the second regions 10b is divided by the dividing region 11 formed with a first straight region passing through the center of the mounting region 1a and a second straight region passing through the center of the mounting region 1a and intersecting the first straight region.

More specifically, with respect to the arrangement of the plurality of light emitting elements 2a, 2b in the longitudinal row and the lateral rows on the base member 1, the fluorescent material region made up of the first regions 10a and the second regions 10b is divided by the dividing region 11 made up of a parallel straight region (for example a first straight region) passing through the center of the mounting region 1a and parallel to the longitudinal row and a perpendicular straight region (for example a second straight region) passing through the center of the mounting region 1a and perpendicularly intersects the parallel straight region. That is, divided by a second imaginary line Y passing through the center of rotation and in parallel to the longitudinal rows, and a first imaginary line X perpendicularly intersects the second imaginary line Y. In other words, the fluorescent material region is divided according to a positional relationship where the first imaginary line X and the second imaginary line Y are in parallel to corresponding sides of the base member 1.

The first imaginary line X and the second imaginary line Y can be set with respect to any given direction as a standard. For example, any side of the outer shape of the light emitting device or a line in parallel to an imaginary line passing through the anode and the cathode can be set as the first imaginary line X or the second imaginary line Y. Any arrangement such as a radial arrangement can be selected from the light emitting elements 2a, 2b, but a regular arrangement of longitudinal rows and lateral rows can facilitate the productivity. Also, the first regions and the second regions are arranged at locations rotationally symmetric to the center of the mounting region which provides good appearance, and the light distribution characteristic can be improved.

In the present embodiment, the wall member 8 is provided, so that the fluorescent material region is divided by the wall member 8 formed along the first imaginary line X and the second imaginary line Y, and made up of total four regions of two first regions 10a, 10a and two second regions 10b, 10b.

As for the arrangement of the four regions, in a plan view of FIG. 2, one of the first regions 10a is formed at a region of upper right and the other of the first regions 10a is formed at a location point symmetry (or line symmetry) to the first region 10a, that is, at a region of lower left. In a similar manner, in a plan view of FIG. 2, one of the second regions 10b is formed at a region of upper left and the other of the second regions 10b is formed at a location point symmetry (or line symmetry) to the second region 10b, that is, at a region of lower right. With this arrangement, four fluorescent material regions are evenly divided with respect to the center of the mounting region 1a.

Next, referring to FIGS. 4, 5, advantageous features of forming of the first regions 10a and the second regions 10b in a radial manner with respect to the center of the mounting region 1a will be described with comparison of light emitting device of a comparative example in which the fluorescent material region is divided in concentric shapes.

Figure 4A:
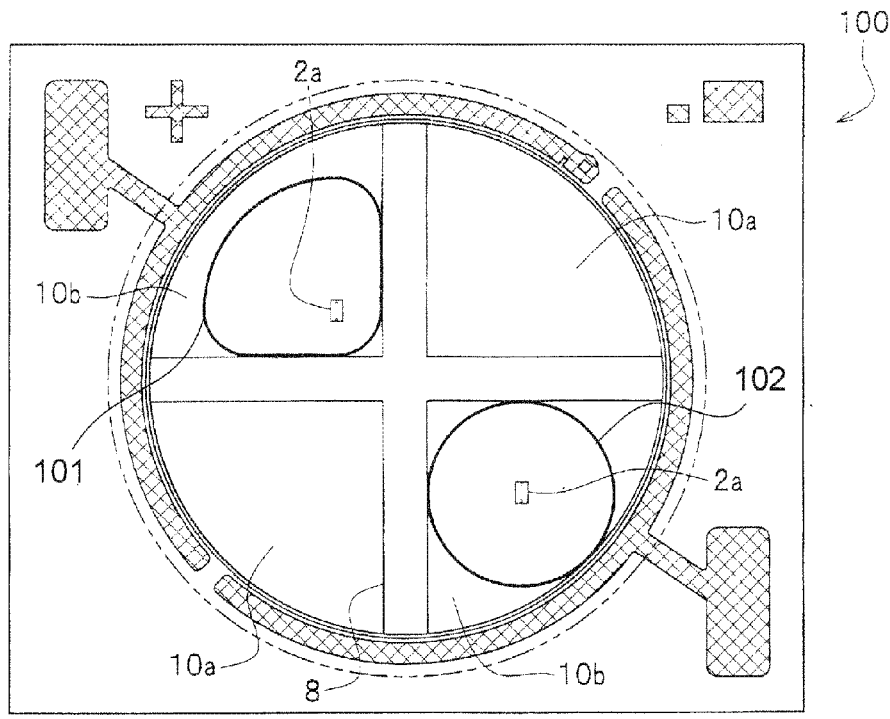
FIG. 4A is a schematic diagram illustrating excitation of a fluorescent material with light of a light emitting element in a light emitting device according to the present invention.
Figure 4B:
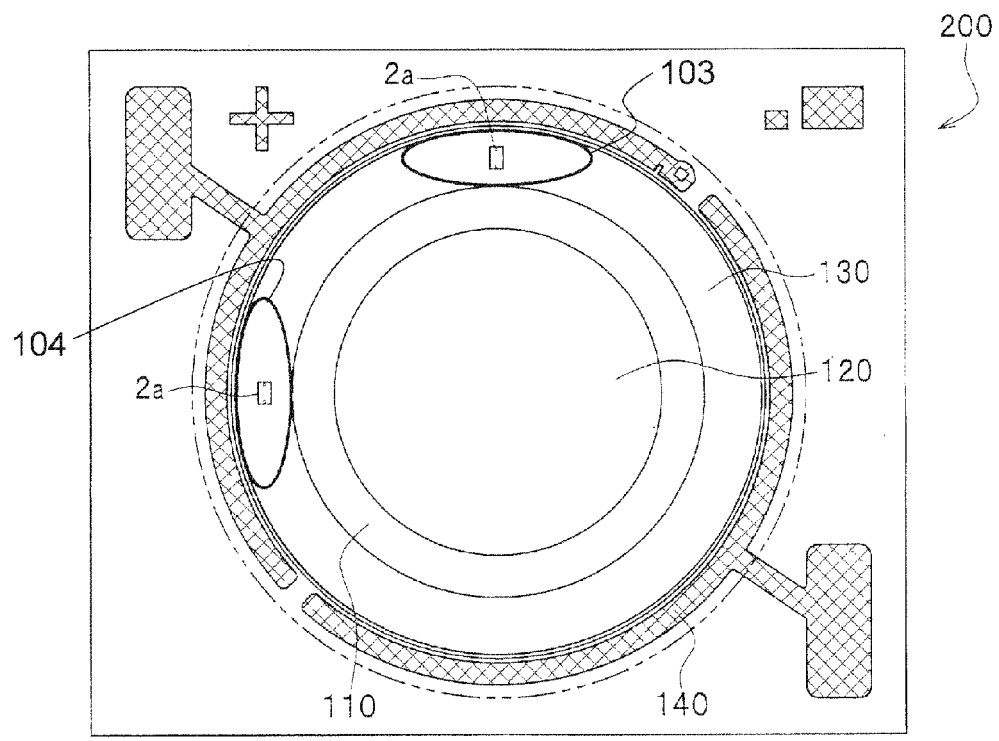
FIG. 4B is a schematic diagram illustrating excitation of a fluorescent material with light of a light emitting element in a light emitting device according to a comparative example, in which a fluorescent material region has a concentric shape.

FIG. 4A shows a light emitting device according to the present invention in which the fluorescent material region is divided in a radial manner. FIG. 4B shows a light emitting device according to a comparative example in which the fluorescent material region is divided in concentric shapes. The ratio of planar dimensions of the inner region 120 and the external region 130 is set approximate to the ratio of planar dimensions (approximately 1:1) of a sum of the planar dimensions of the first regions 10a and a sum of the planar dimensions of the second regions 10b in the light emitting device according to the present invention, and the width of the inner frame 110 is approximate to the wall member 8 of the light emitting device according to the present invention shown in FIG. 4A. The reason of employing such a shape is that, in the case of obtaining a white light (for example a color equivalent to conventional incandescent lamp color) having good color rendering property by such a light emitting device, the planar dimensions of the two fluorescent material regions are preferably approximately the same, in order to balance the mixed color of yellow light and blue light, and the mixed color of red light and blue light. However, in this case, forming the two fluorescent material regions of the outer side region and the inner side region with approximately the same planar dimensions resulting in a considerably small width of the outer region in the diameter direction, which leads a decrease of the light emitting efficiency.

As shown in FIG. 4A, in the light emitting device 100 according to the present invention, the second region 10b has a shape which can facilitate light emitted from one of the first light emitting elements 2a in the second region 10b reaching as many fluorescent material in the second region 10b. That is, in the light emitting device 100 according to the present invention, for example, the second region 10b does not have a surface which inhibits propagation of light emitted from the first light emitting elements 2a in the second region 10b, so that light from one light emitting element (first light emitting element 2a) can excite the fluorescent material in a wider range in the same region (in FIG. 4A, an example of the range where the light emitted from the first light emitting element 2a can reach is shown by the frames 101, 102 around the first light emitting elements 2a). Thus, when overlapping the light from each of all the first light emitting elements 2a included in the second region 10b, light from each of the first light emitting elements 2a can be superimposed to create multiple layers of light. In other words, when viewed from the fluorescent material side, one fluorescent material particle is excited by a larger number of the first light emitting elements 2a, thus, very high light emitting efficiency of the light emitting device 100 can be obtained. In the case where the light emitting elements are disposed near the wall member 8 (the second region 10b at upper left) and in the case where the light emitting elements are disposed at the center (the second region 10b at lower right) makes some difference in spreading of light (an example of a range where the light emitted from the first light emitting element 2a which is disposed near the wall member 8 can reach is shown by the frame 101, and a range where the light emitted from the first light emitting element 2a which is disposed at the center of the second region 10b can reach is shown by the frame 102), but as a whole, light from the light emitting element can be facilitated to reach the entire of the region. Contrary, as shown in FIG. 4B, in the conventional light emitting device 200, the outer region 130 has a concentric shape with which light emitted from one of the first light emitting elements 2a which is disposed in the outer region 130 is difficult to reach an other region in the outer region 130. That is, the conventional light emitting device 200 has an inner frame 110 which inhibits propagation of light from the first light emitting element 2a disposed in the second region 10b. Accordingly, with the light emitting device 200 employing a concentric shape, in the outer-side region 130 surrounded by the concentric inner frame 110 and outer frame 140, light from one light emitting element (first light emitting element 2a) is blocked by adjacent inner frame 110 and outer frame 140 and spread in only a small limited range of the outer-side region 130 (in FIG. 4B, the range where light emitted from the first light emitting element 2a reaches is shown by the frames 103, 104 around the first light emitting elements 2a). Therefore, emission from one light emitting element can excite only a small portion of the fluorescent material. Thus, when overlapping the light from each of all the first light emitting elements 2a included in the outer region 130, light from each of the first light emitting elements 2a is not so much overlapped. In other words, when viewed from the fluorescent material side, smaller number of the first light emitting element 2a excite a fluorescent material particle, resulting in a considerably low light emitting efficiency in the light emitting device 200.

Further, the planar dimension of one region (for example one second region 10b) in the light emitting device 100 according to the present invention corresponds to a half of the planar dimension of the outer region 130 of the light emitting device 200 employing a concentric shape. In addition, the range where light from one light emitting element spreads is almost the entire region of one second region 10b with the shape employed in the light emitting device 100 according to the present invention, but with a concentric shape, only a part of the outer region 130 as described above, which is far from a half of the planar dimension of the outer region 130. As described above, there is a large difference in the range where the emission of the light emitting element can reach, and emission of the light emitting elements can be used more efficiently with the shape employed in the light emitting device 100 according to the present invention. In the case where the fluorescent material region is simply separated in the left and the right, the fluorescent materials differ in the left and light with respect to the center line, and accordingly, sufficient light distribution property cannot be obtained. According to the present invention, the fluorescent material region is divided in a radial manner, so that light emitted from one light emitting element can be spread approximately the entire region of the second region 10b. Thus, the light emitting device of high light emitting efficiency and good light distribution property can be provided.

Next, adjustment of the planar dimension of the fluorescent material region will be described with reference to FIGS. 5, 6. The number of the light emitting elements necessary to each of the fluorescent material regions depends on the fluorescent material to be used and the color tone to be obtained, but generally, the number of elements in the region of yellow fluorescent material: the number of elements in the region of red fluorescent material is about 1:1 to 3:2.

A typical problem of a light emitting device in which two kinds of fluorescent material regions are separated (for example, yellow fluorescent material and red fluorescent material are disposed in different regions) is that, different from a conventional light emitting device of incandescent lamp color (yellow fluorescent material and red fluorescent material are disposed in one region), the number of the light emitting elements is also an important factor in adjusting the color tone. In the conventional light emitting devices, a sealing member mixed with fluorescent materials is disposed on all the light emitting elements, so that the color tone can be adjusted by adjusting the concentration ratio of the fluorescent materials. Whereas, in the light emitting devices in which the fluorescent regions are separated, only one kind of fluorescent material is disposed on some of the light emitting elements, which limits the emission which can be used in wavelength conversion of each fluorescent material, and adjustment of the color tone is difficult to obtain by simply changing the concentration of the fluorescent materials (for example, in the case where only the concentration of yellow fluorescent material is increased, yellow light will increase but little increase will result in white light which is obtained by mixing yellow light and blue light. For this reason, adjustment of color tone is needed also by increasing or decreasing of the number of the light emitting elements.

Figure 5A:
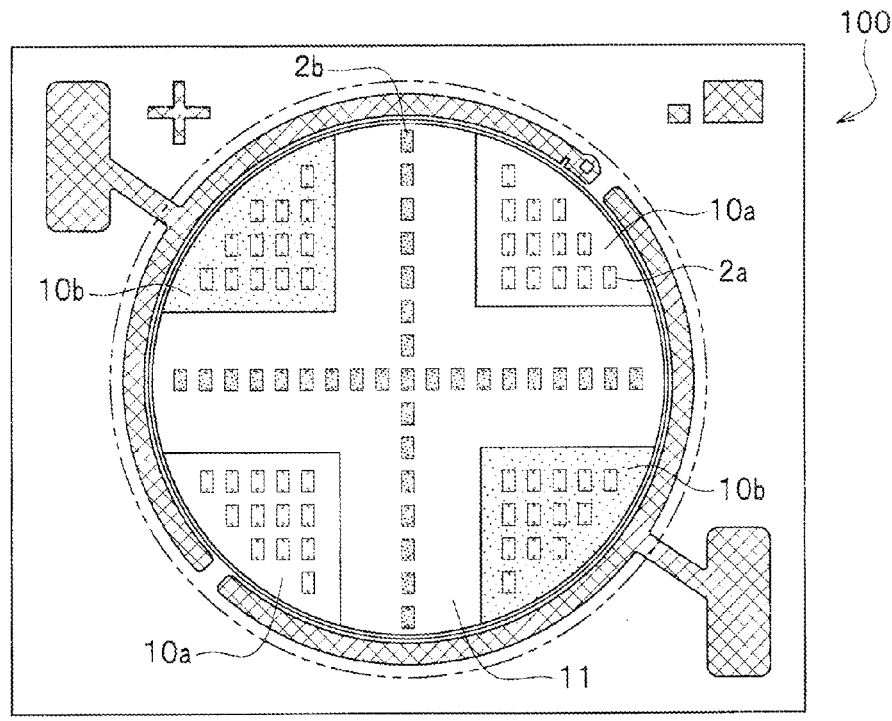
FIGS. 5A, 5B are schematic diagrams illustrating an adjustment of areas of a first region and a second region at a time of increasing or decreasing of the number of light emitting elements in a light emitting device according to the present invention.
Figure 5B:
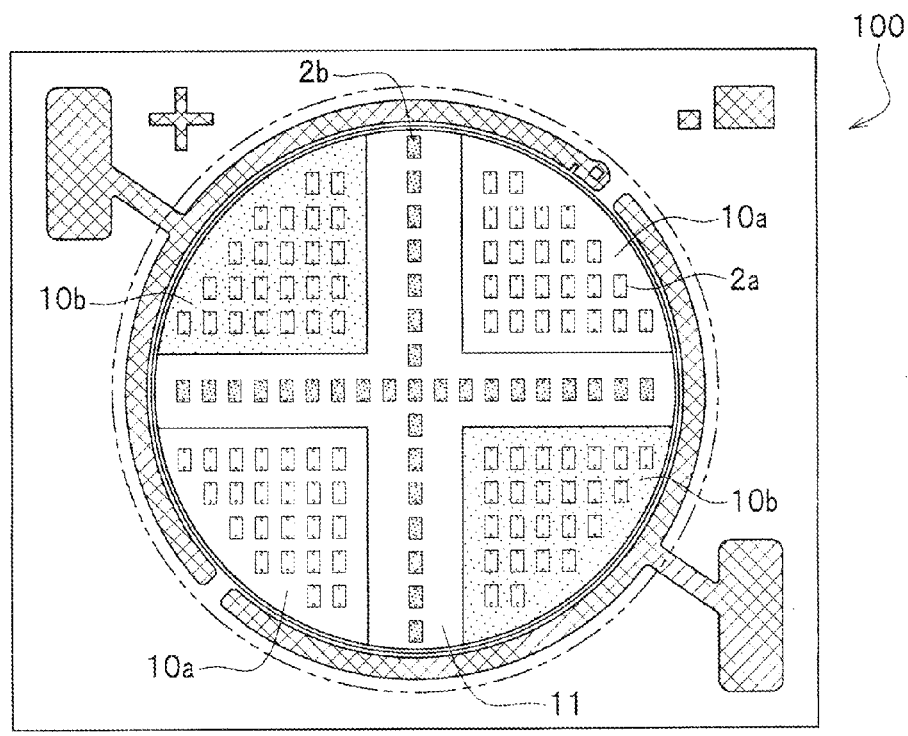

As shown in FIGS. 5A, 5B, in the light emitting device 100 of the present invention, with increasing and decreasing of the number of the first light emitting elements 2a, the width of the dividing region 11 is adjusted. Thus, while having approximately a same number of the light emitting elements in the first regions 10a and the second regions 10b, the planar dimensions of the first regions 10a, 10a and the second regions 10b, 10b can be easily adjusted.

Figure 6A:
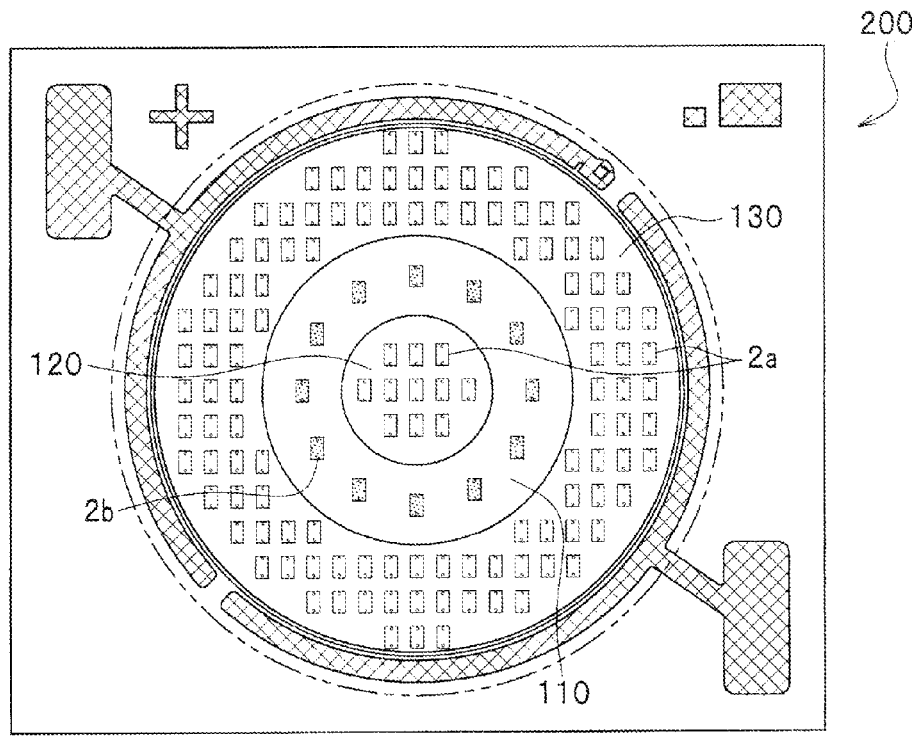
FIGS. 6A, 6B are schematic diagrams illustrating an adjustment of areas of a inner region and a outer region at a time of increasing or decreasing of the number of light emitting elements in a light emitting device according to a comparative example, in which a fluorescent material region has a concentric shape.
Figure 6B:
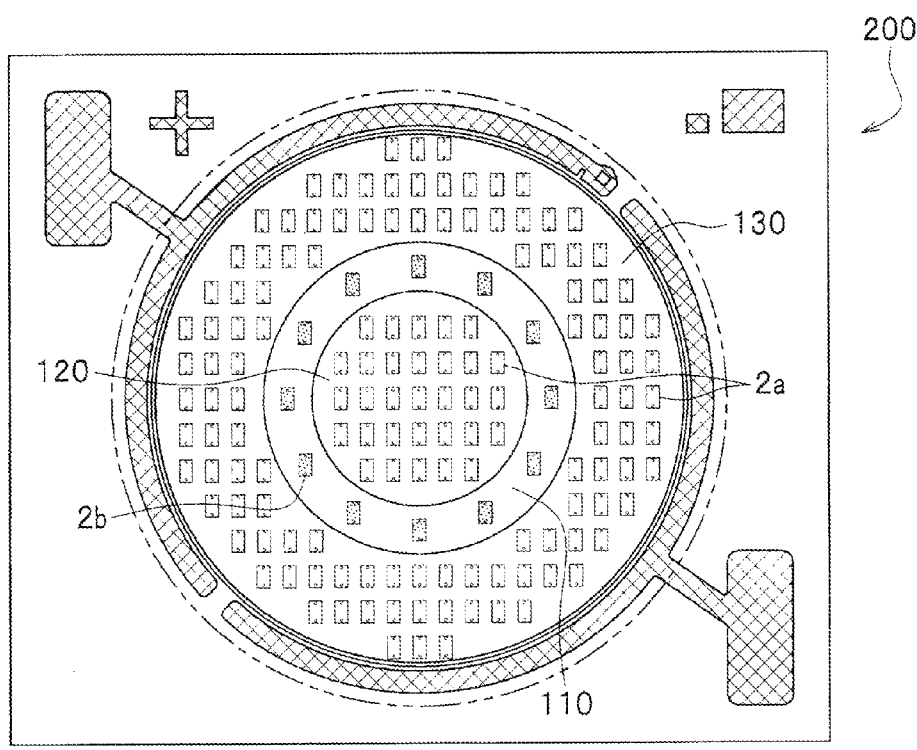

In the case where a concentric shape is employed and in the case where more than a certain number of the light emitting elements to be disposed as a whole, the outer frame 140 and the inner frame 110 are arranged closely and the width of the outer region 130 is decreased. Thus, the number of the light emitting elements in the outer region 130 and the inner region 120 can be approximate, or the number of the light emitting elements in the outer region 130 can be reduced with respect to the number of the light emitting elements in the inner region 120. However, as described above, decreasing of the width of the outer region 130 tends to increase blocking of light by the inner frame 110 and the outer frame 140, leading to an decrease of the light emitting efficiency. For this reason, in order to increase the light emitting efficiency, a large planar dimension is needed to the outer region 130. As shown in FIGS. 6A, 6B, even in the light emitting device 200 employing a concentric shape, the planar dimension of the inner region 120 can be adjusted by changing the width of the inner frame 110. However, as described above, if the planar dimension of the outer region 130 is increased to dispose more than a certain number of the light emitting elements, the number of the light emitting elements in the outer region 130 becomes larger than the number of the light emitting elements in the inner region 120. Thus, in the case where a similar number of the light emitting elements to be disposed in the outer region 130 and the inner region 120, or a smaller number of the light emitting elements to be disposed in the outer region 130, a concentric shape is inappropriate. However, with the shape employed in the present invention, the size of each region can be changed at will without a limitation as described above.

Other than as described above, the shape employed in the present invention has advantageous features compared to the case employing a concentric shape. In the case of a concentric shape, the sealing member is blocked by the inner frame 110 and difficult to spread in the outer region 130, so that the sealing member is needed to be injected from plural locations. At this time, due to irregularity in the amount of injection or irregularity in spreading of the sealing member, uneven distribution of the sealing member tends to occur. On the other hand, the structure employed in the present invention allows injection of the sealing member into any regions of the first regions 10a, 10a and the second regions 10b, 10b from a single location, so that uneven distribution of the sealing member does not easily occur. In the specification, a concentric shape is described as a comparative example, but is not limited to a concentric shape, other shapes, for example concentrically arranged polygonal shape (rectangular shape) can be described in a same manner.

Wall Member

The wall member 8 is formed along the dividing region, for example along the first imaginary line X and the second imaginary line Y, to divide the fluorescent material regions made of the first regions 10a and the second regions 10b. That is, the wall member 8 is disposed between the first regions 10a, 10a, between the second regions 10b, 10b, and between the first region 10a and the second region 10b, so as to protrude from the base member 1, as a wall dividing those regions. Dividing the fluorescent material region by the wall member 8 facilitates injection of the sealing members 7a, 7b, which facilitates the manufacturing. Also, the wall member 8 is disposed in the dividing region 11 to cover the second light emitting elements 2b, and formed higher than the light emitting elements 2a, 2b. The wall member 8 is, in the specification, as shown in FIG. 3, formed with an arc shape in the cross section.

The surface of the wall member 8 may be mounded to form a lamp shape or a convex lens shape.

The material of the wall member 8 has light-transmissive property to allow light from the light emitting elements 2a, 2b to pass through. Examples of the material include a silicone resin, an epoxy resin, and a urea resin. The wall member 8 has light transmissive property so that the emission colors of the first region 10a and the second region 10b can be mixed, so that irregularity in color can be improved. In addition to such materials, a fluorescent material can be contained, but the amount of the fluorescent material in the wall member 8 is preferably smaller than the amount of the fluorescent material contained in the first regions 10a and the second regions 10b, and further, the wall member 8 preferably does not contain fluorescent material. With a small amount of the fluorescent material in the wall member 8, light in the wall member 8 is not easily scattered by the fluorescent material in the wall member, and if the wall member does not contain a fluorescent material, the light is not scattered by the fluorescent material. Accordingly, light in the wall member 8, in the embodiment, light of the second light emitting elements 2b can be extracted efficiently.

In the case where the wall member 8 contains a fluorescent material, the fluorescent material region is made up of a combination of the fluorescent material region made of first region 10a and the second region 10b (fluorescent material region which does not contain a wall member) and the fluorescent material region made of the wall member 8. Further, in the wall member 8, a coloring agent, a light diffusing agent, a filler etc., can be contained as needed. Also the filling amount of the wall members 8 which is sufficient to cover the light emitting elements 2b, the wires W etc is needed. As described above, changing the width of the wall member 8 facilitates adjustment of the planar dimensions of the first regions 10a, 10a, and the second regions 10b, 10b.

Either the light-reflecting member 6 and the wall member 8 can be formed first or they can be made concurrently, but forming the wall member 8 first and then forming the light-reflecting member 6 to cover an end portion of the wall member 8 allows prevention of the wall member 8 from creeping up the light-reflecting member 6, and therefore, preferable. Either one of them can be formed. A resin discharge device can be used for formation of the wall member 8. After ejecting the resin, the resin will spread over time, so that the resin is preferably cured at an appropriate time to retain the shape of the wall. Particularly, in the case of mass production, intervals between the processes increase, so that without curing at some time, the resin which forms the wall may spread and lowered.

Fluorescent Material

The fluorescent material is a fluorescent member serves as a wavelength converting member which absorbs at least part of light from the semiconductor light emitting elements 2a, 2b and emits light in different wavelength. The fluorescent material is made up of a first fluorescent material contained in the first sealing member 7a and a second fluorescent material contained in the second sealing member 7b and has an emission wavelength different from the emission wavelength of the first fluorescent material. Further, as described above, in the case where the fluorescent material is contained in the wall member 8, the same fluorescent material as the first fluorescent material or the second fluorescent material can be employed, or a third fluorescent material which has an emission wavelength different from the emission wavelengths of the first fluorescent material and the second fluorescent material can be employed. In the case where the third fluorescent material is used, selecting a fluorescent material having an emission wavelength between the emission wavelength of the first fluorescent material and the second fluorescent material 2a can improve the color rendering properties of the light emitting device 100. In this case, the same as the first light emitting elements 2a may be used for the second light emitting elements 2b.

In the light emitting device 100 according to the present invention, in order to prevent emission of a fluorescent material from being absorbed by other fluorescent material, fluorescent materials of different kinds are arranged separately in the first region 10a and the second region 10b. However, in the case where the fluorescent materials of different kinds have small absorption to each other, plural kinds of such fluorescent materials can be used as the first fluorescent material. The expression "small absorption" in the specification refers to a small absorption compared to the second fluorescent material. Generally, fluorescent materials of close wavelengths and/or close compositions are selected. In a similar manner, for the second fluorescent material, plural kinds of fluorescent material can be used as the second fluorescent material. However, preferably, for both the first fluorescent material and the second fluorescent material, one kind of fluorescent material is preferable to employ (because absorption can be minimized).

For the material of the fluorescent material, for example, a YAG-based fluorescent material, a nitride-based fluorescent material, an oxynitride-based fluorescent material, etc., can be used. In the case where the emission wavelength of the first fluorescent material is shorter than the emission wavelength of the second fluorescent material, for the first fluorescent material, for example, a YAG-based fluorescent material which is a fluorescent material of short wavelength side and emits yellow light can be employed, and for the second fluorescent material, CASN-based fluorescent materials such as (Sr, Ca)AlSiN$_3$:Eu(SCASN), CaAlSiN$_3$:Eu(CASN), or SrAlSiN$_3$:Eu which is a fluorescent material of long wavelength side and emits red light can be employed. For the third fluorescent material, a fluorescent material having an emission wavelength different from the emission wavelengths of the first fluorescent material and the second fluorescent materials to be selected.

Wire

The wires W are electrically conductive wiring for electrically connecting the electrical components such as the light emitting elements 2a, 2b, and the protective element 5 with the positive terminal 3 and the negative terminal 4. Examples of the material for the wire W include a metal such as Au, Cu (copper), Pt (platinum), Al (aluminum), and an alloy of those, and particularly, Au which has good thermal conductivity is preferably used.

Transparent Member

Figure 3:
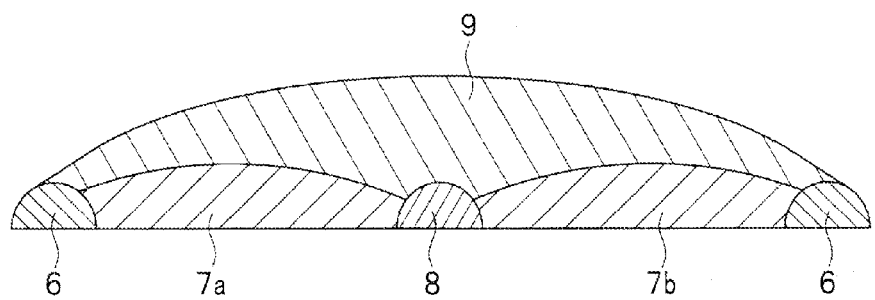
FIG. 3 is a sectional view taken along line A-A of FIG. 1.

As shown in FIG. 3, the transparent member 9 is a member which covers the sealing members 7a and 7b in an integral manner. With a transparent member 9, irregularity in emission color of the light emitting device as a whole, particularly the outer peripheral portion of the light emitting device can be improved. The expression "covers the sealing members 7a and 7b in an integral manner" refers to that, as the four regions of the first regions 10a, 10a, and the second regions 10b, 10b one group, cover the first region 10a, 10a, the second region 10b, 10b, and the dividing region 11. That is, it is not meant that, with using the dividing region 11 as a boundary, and for example, the first regions 10a, 10a, and the second regions 10b, 10b are separated in four regions to cover the sealing members 7a, 7b. More specifically, in the embodiment, the transparent member 9 is disposed in the mounting region 1a so as to cover the sealing members 7a, 7b and the wall member 8 from above to form an approximately elliptical arc shape (a convex lens shape) in a cross-sectional view. The transparent member 9 can be formed on the base member 1 by injecting a member such as a resin in the mounting region 1a surrounded by the light-reflecting member 6.

A material having light transmissivity which allows light from the light emitting elements 2a, 2b to pass through is preferable for the transparent member 9. Specific examples thereof include a silicone resin, an epoxy resin, and a urea resin. In addition to above-described materials, a coloring agent, a filler or the like, can be included as needed. Depending on the light emitting device, a light diffusing agent may be contained, but in the present invention, a light diffusing agent is preferably not to be used.

The transparent member 9 can be formed with a single member or with two or more of a plurality of layers. The filling amount of the transparent member 9 needs to be sufficient to cover the sealing members 7a, 7b and the wall member 8. In the case where the transparent member 9 to serve as a lens, the surface of the transparent member 9 may be mounded to form a convex lens shape or a lamp shape as shown in FIG. 3. Such a convex lens shape as shown in FIG. 3 can be formed, for example, by surface tension of the transparent member 9.

In the case where the first sealing member 7a, the second sealing member 7b, and the transparent member 9 are made of resins and the sealing members 7a, 7b are formed by using surface tension, the first sealing member 7a and the second sealing member 7b are cured before forming the transparent member 9, so that mixing of the first sealing member 7a and the second sealing member 7b can be prevented. If the transparent member 9 is disposed without curing the first sealing member 7a and the second sealing member 7b, the sealing member 7a, 7b and the transparent member 9 are mixed, which may lead the first sealing member 7a and the second sealing member 7b move over the wall member 8 and mix with each other.

Also, after the process of forming the transparent member 9, the first sealing member 7a, the second sealing member 7b, and the transparent member 9 are cured concurrently, which allows those members to integrate, and a structure in which the members are difficult to detach from each other can be obtained. The first sealing member 7a and the second sealing member 7b are preferably designed so as not to mix with each other, so that for example, the surfaces of the sealing members 7a, 7b may be formed lower than the wall member 8 (which has been cured). The term "form" used herein refers to a state of before curing or a state of after curing, and for example, the expression "form the wall member 8" refers to simply shape the wall member 8 without curing, or to shape the wall member 8 and then cure it. A resin discharge device can be used for formation of the transparent member 9.

Figure 7:
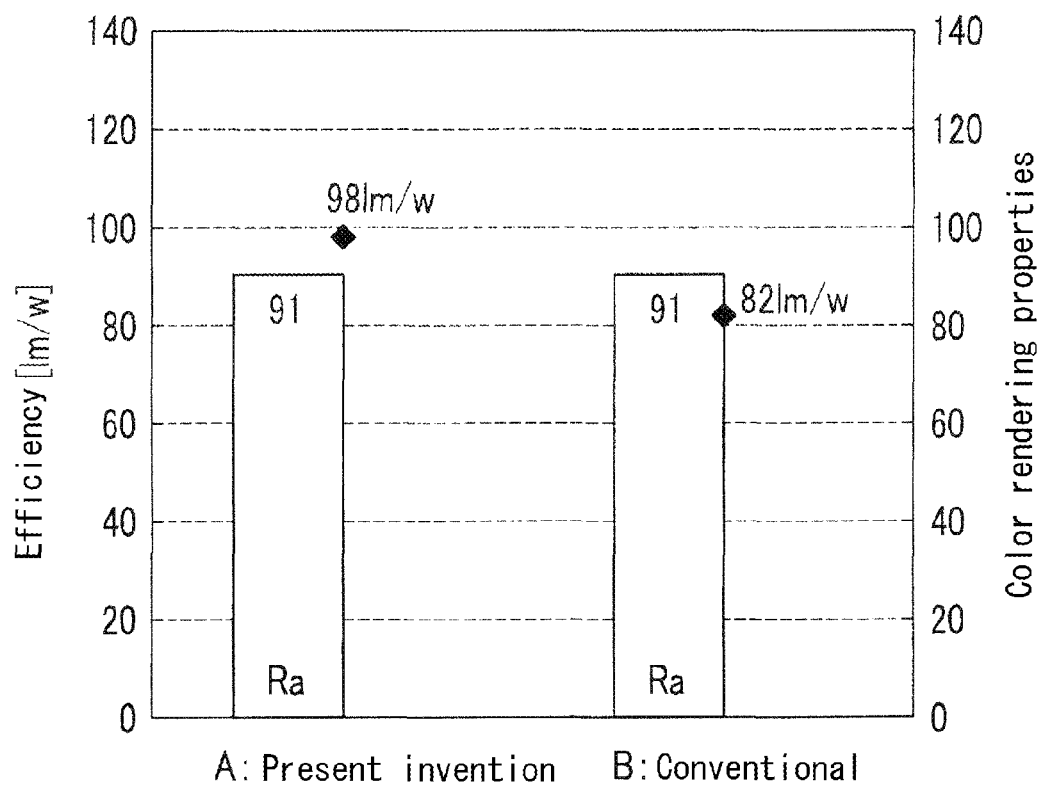
FIG. 7 is a graph showing light emitting efficiency (lm/W) and color rendering properties of a light emitting device according to the present invention and a conventional light emitting device which employs three kinds of fluorescent materials.
Figure 8:
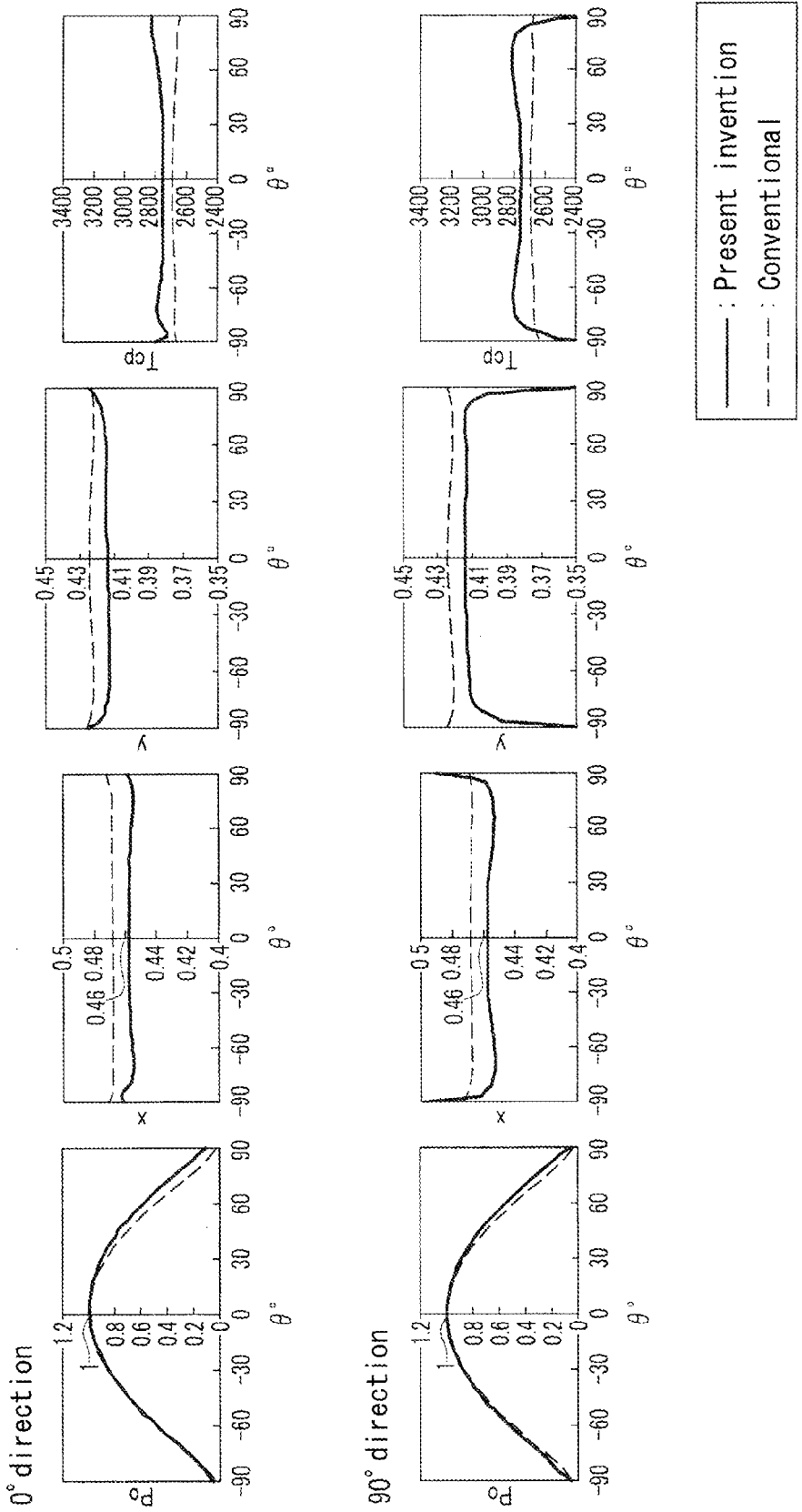
FIG. 8 is diagrams respectively showing a power correlation ratio in a direction of a first virtual line (0° direction) and in a direction of a second virtual line (90° direction), chromaticity coordinates based on the chromaticity diagram, and a color temperature of a light emitting device according to the present invention and a conventional light emitting device employing three kinds of fluorescent material.

Next, with reference to FIGS. 7, 8, effects of the present invention will be described. In FIGS. 7, 8, A represents data on the light emitting device 100 according to Embodiment 1 of the present invention, and B represents data on a conventional light emitting device (3 blend-type light emitting device) in which 3 kinds of fluorescent materials, a YAG-based fluorescent material and a SCASN-based fluorescent material, and an additional chlorosilicate, are mixed in a single sealing resin, and blue light emitting elements are sealed with the sealing resin. In the light emitting device 100, the first sealing member 7a contains a YAG-based fluorescent material, the second sealing member 7b contains a SCASN fluorescent material, and the wall member 8 does not contain a fluorescent material. Also, in the light emitting device 100, a blue light emitting element is used for the first light emitting elements 2a and a blue-green light emitting element is used for the second light emitting elements 2b. Each of the fluorescent materials and the blue light emitting element used herein are of the same kinds as in the conventional light emitting devices.

FIG. 7 is a graph showing light emitting efficiency (lm/W) and color rendering properties, in which, Ra represents a general color rendering index. FIG. 8 is diagrams respectively showing a power correlation ratio in a direction of a first virtual line (0° direction) and in a direction of a second virtual line (90° direction), in which, $P_o$ represents a power correlation ratio, x and y represent chromaticity coordinates, Tcp represents a color temperature, and θ represents a light distribution angle.

As shown in FIG. 7, as to the color rendering properties, the light emitting device according to the present invention exhibits a similar degree as that of the conventional light emitting device. Further, the light emitting device according to the present invention exhibits about 20% improvements in the light emitting efficiency (lm/W) compared to the conventional light emitting device. As shown above, compared to the conventional 3-blend-type light emitting device, the light emitting device according to the present invention provides the color rendering properties with almost no decrease, and improved light emitting efficiency (lm/W). Also, as shown in FIG. 8, the light emitting device according to the present invention can be said to have good light distribution characteristic approximate to that of the conventional light emitting device in a direction of a first virtual line (0° direction) and in a direction of a second virtual line (90° direction).

Performance of Light Emitting Device

With the light emitting device 100 described above, upon operating the light emitting device 100, of the light travelling in all directions from the light emitting elements 2a, 2b, light travelling upward is extracted to outside above the light emitting device 100. Light travelling downward, in lateral directions, etc., is reflected at the bottom surface or the side surfaces of the mounting region 1a of the base member 1 and is extracted to above the light emitting device 100. At this time, the bottom surface of the base member 1, that is on the mounting region 1a, a covering of a metal layer is preferably applied, a light-reflecting member 6 is preferably formed around the mounting region 1a, so that absorption of light by the portion can be prevented and also light can be reflected by the metal layer and the light-reflecting member 6. With this arrangement, light from the light emitting elements 2a, 2b can be extracted efficiently. According to the light emitting device according to Embodiment 1 of the present invention, a light emitting device having high light emitting efficiency and good brightness distribution, further having high color mixing and light distribution properties can be provided.

Embodiment 2

Figure 10:
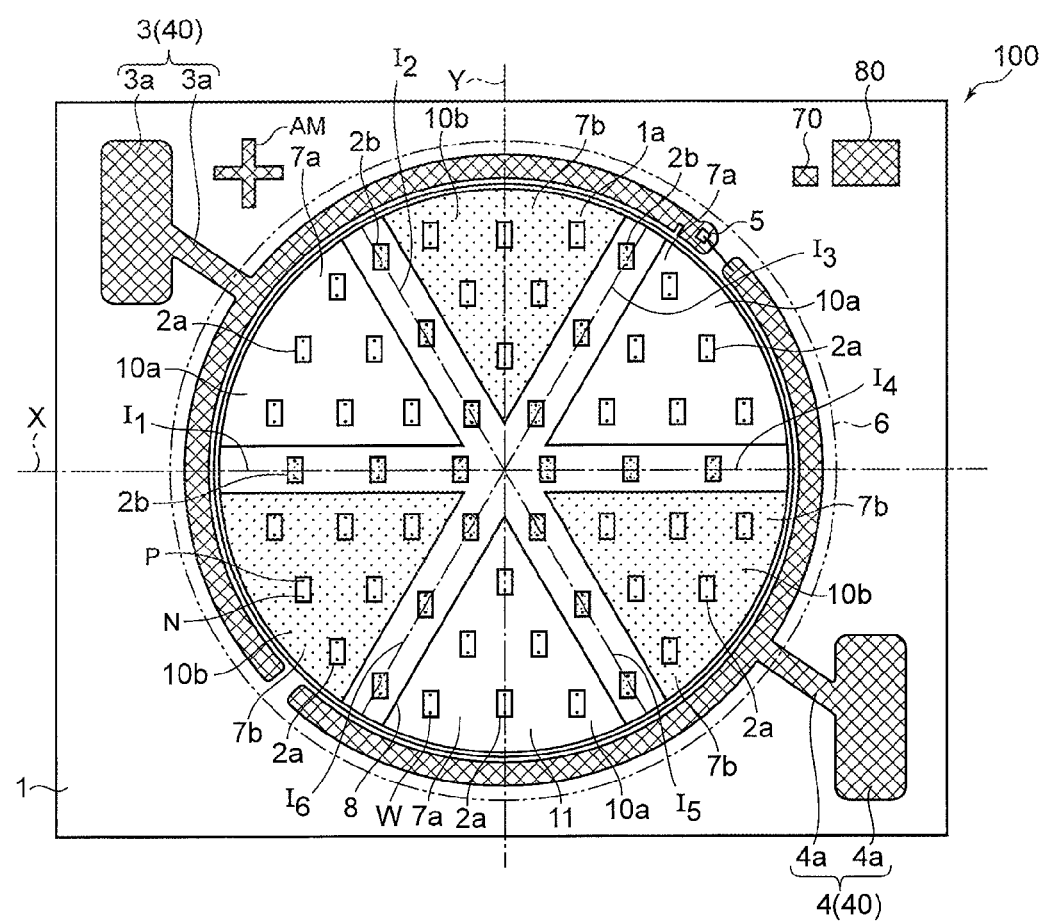
FIG. 10 is a top view showing a structure of a light emitting device according to Embodiment 2 of the present invention.

FIG. 10 is a top view of a light emitting device according to Embodiment 2 of the present invention. In Embodiment 1, the fluorescent material region formed on the base member 1 is divided in four in a radial manner, but Embodiment 2 differs in that it is divided in six in a radial manner.

As shown in FIG. 10, the light emitting device 100 according to Embodiment 2 includes a base member 1, a plurality of light emitting elements (first light emitting elements 2a) arranged on a mounting region 1a of the base member 1, and a sealing member sealing the light emitting elements (first light emitting elements 2a). The base member 1 has six regions divided by imaginary lines $I_1$ to $I_6$ extending in a radial manner from one point (preferably the center (center of gravity) of the base member) to outer periphery of the base member and also has a light-transmissive wall member 8 between adjacent two regions of the six regions. Each region of the six regions is provided with a sealing member which contains a fluorescent material. The color tone of light emitted from one region of adjacent two regions among the six regions differs from the color tone of light emitted from the other regions.

The fluorescent material region on the base member 1 is, as shown in FIG. 10, divided in six in a radial manner by a wall member 8 formed in a dividing region 11. That is, the wall member 8 is formed centering the center point (center of gravity) of the base member 1, along an imaginary line $I_1$ extending along a first direction (for example, in a direction extending leftward from the origin of X-axis (center point of the base member 1) along the X-axis, along an imaginary line $I_2$ extending along a second direction which is 60° rotated clockwise with respect to the first direction, along an imaginary line $I_3$ extending along a third direction which is 120° rotated clockwise with respect to the first direction, along an imaginary line $I_4$ extending along a fourth direction which is 180° rotated clockwise with respect to the first direction, along an imaginary line $I_5$ extending along a fifth direction which is 240° rotated clockwise with respect to the first direction, and along an imaginary line $I_6$ extending along a sixth direction which is 300° rotated clockwise with respect to the first direction. Thus, the fluorescent material region is divided in six fan-shaped regions by the wall member 8 formed as described above. The six fan-shaped regions are made up of a first region 10a which is a region provided with the first sealing member 7a and a second region 10b which is a region provided with a second sealing member 7b, and three of each of the first region 10a and the second region 10b are included, and as shown in FIG. 10, the first regions 10a and the second regions 10b are alternately arranged so that different regions are adjacent each other as the first region 10a and the second region 10b.

The light emitting device according to Embodiment 2 has a fluorescent material region divided in six in a radial manner, so that the center angle(s) of the first regions 10a and the second regions 10b are smaller than the case where the region is divided in four. In the case where the center angle of the first regions 10a is large, the distance from a region of the first region 10a adjacent to the second region 10b to the second region 10b is small. Therefore, light discharged from the region of the first region 10a adjacent to the second region 10b may be mixed with light discharged from the second region 10b adjacent to the first region 10a, but light discharged from the center region of the first region 10a is not easily mixed with the light discharged from the second region 10b adjacent to the first region 10a, due to a large distance from the center region of the first region 10a to the second region 10b. Similarly, in the case where the center angle of the second region 10b is large, light discharged from the center region of the second region 10b is not easily mixed with the light discharged from the first region 10a adjacent to the second region 10b. However, in the case where the center angle of the first regions 10a is smaller, due to a small distance from the center region of the first region 10a to the second region 10b, light discharged from the center region of the first region 10a is easily mixed with the light discharged from the second region 10b adjacent to the region. Similarly, in the case where the center angle of the second region 10b is smaller, light discharged from the center region of the second region 10b is easily mixed with the light discharged from the first region 10a adjacent to the second region 10b. Thus, the light emitting device according to Embodiment 2 has a fluorescent material region divided in six in a radial manner, so that the center angle(s) of the first regions 10a and the second regions 10b are smaller than the case where the region is divided in four. Accordingly, light emitted from the center region of the second region 10b is more easily mixed with the light discharged from the first region 10a adjacent to the region, so that a high degree of color-mixing can be obtained.

Embodiment 3

Figure 11:
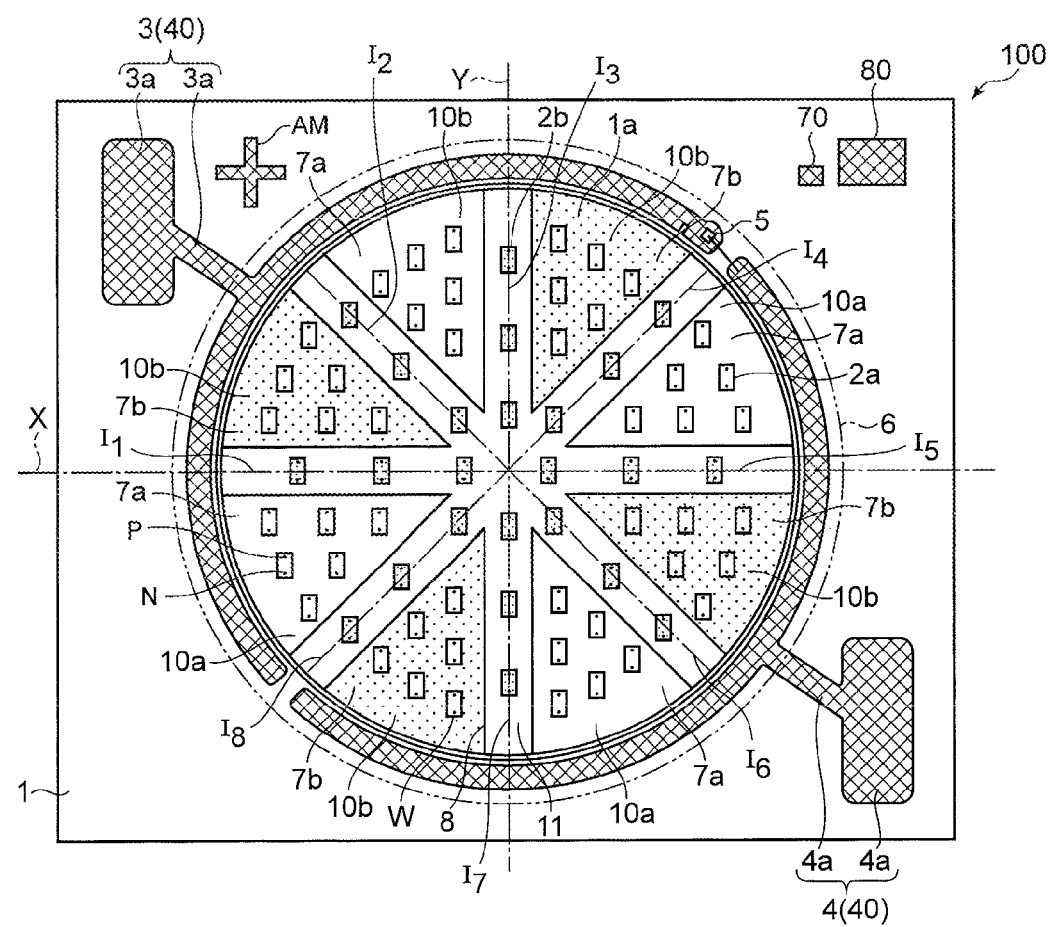
FIG. 11 is a top view showing a structure of a light emitting device according to Embodiment 3 of the present invention.

FIG. 11 is a top view of a light emitting device according to Embodiment 3 of the present invention. In Embodiment 1, the fluorescent material region formed on the base member 1 is divided in four in a radial manner, but Embodiment 3 differs in that it is divided in eight in a radial manner.

As shown in FIG. 11, the light emitting device 100 according to Embodiment 3 includes a base member 1, a plurality of light emitting elements (first light emitting elements 2a) arranged on a mounting region 1a of the base member 1, and a sealing member sealing the light emitting elements (first light emitting elements 2a). The base member 1 has eight regions divided by imaginary lines $I_1$ to $I_8$ extending in a radial manner from one point (preferably the center (center of gravity) of the base member) on the base member 1 to outer periphery of the base member and also has a light-transmissive wall member 8 between adjacent two regions of the eight regions. Each region of the eight regions is provided with a sealing member which contains a fluorescent material. The color tone of light emitted from one region of adjacent two regions among the eight regions differs from the color tone of light emitted from the other region.

The fluorescent material region on the base member 1 is, as shown in FIG. 11, divided in eight in a radial manner by a wall member 8 formed in a dividing region 11. That is, the wall member 8 is formed centering the center point (center of gravity) of the base member 1, along an imaginary line $I_1$ extending along a first direction (for example, in a direction extending leftward from the origin of X-axis (center point of the base member 1) along the X-axis, along an imaginary line $I_2$ extending along a second direction which is 45° rotated clockwise with respect to the first direction, along an imaginary line $I_3$ extending along a third direction which is 90° rotated clockwise with respect to the first direction, along an imaginary line $I_4$ extending along a fourth direction which is 135° rotated clockwise with respect to the first direction, along an imaginary line $I_5$ extending along a fifth direction which is 180° rotated clockwise with respect to the first direction, along an imaginary line $I_6$ extending along a sixth direction which is 225° rotated clockwise with respect to the first direction, along an imaginary line $I_7$ extending along a seventh direction which is 270° rotated clockwise with respect to the first direction, and along an imaginary line $I_8$ extending along a eighth direction which is 315° rotated clockwise with respect to the first direction. Thus, the fluorescent material region is divided in eight fan-shaped regions by the wall member 8 formed as described above. The eight fan-shaped regions are made up of a first region 10a which is a region provided with the first sealing member 7a and a second region 10b which is a region provided with a second sealing member 7b, and four of each of the first region 10a and the second region 10b are included, and as shown in FIG. 11, the first regions 10a and the second regions 10b are alternately arranged so that different regions are adjacent each other as the first region 10a and the second region 10b.

The light emitting device according to Embodiment 3 has a fluorescent material region divided in eight in a radial manner, so that the center angles of the first regions 10a and the second regions 10b are smaller than the case where the region is divided in four. As described above, in the case where the center angle of the first regions 10a is large, light discharged from the center region of the first region 10a is not easily mixed with the light discharged from the second region 10b adjacent to the region, and similarly, in the case where the center angle of the second regions 10b is large, light discharged from the center region of the second region 10b is not easily mixed with the light discharged from the first region 10a adjacent to the region. But, in the case where the center angle of the first regions 10a is smaller, light discharged from the center region of the first region 10a is easily mixed with the light discharged from the second region 10b adjacent to the region, and similarly, in the case where the center angle of the second regions 10b is small, light discharged from the center region of the second region 10b is easily mixed with the light discharged from the first region 10a adjacent to the region. Thus, the light emitting device according to Embodiment 3 has a fluorescent material region divided in eight in a radial manner, so that the center angles of the first regions 10a and the second regions 10b are smaller than the case where the region is divided in four. Accordingly, light emitted from the center region of the second region 10b is more easily mixed with the light discharged from the first region 10a adjacent to the region, so that a high degree of color-mixing can be obtained.

Also, the first regions with each other and the second regions with each other can be arranged at locations rotated 180° around the one point of the base member as a center point, so that in a cross-sectional plane passing through the center of the base member, the regions of a same fluorescent material can be arranged symmetrically with respect to the center. With the structure as described above, luminance distribution (light intensity distribution) can be close to uniform, and further, good optical orientation characteristics can be obtained.

In the above, embodiments of the present invention are described, but the present invention is not limited to the embodiments described above and changed can be applied within the scope that does not deviated from the gist of the present invention. That is, the embodiments of the light emitting device described above are intended as examples of a light emitting device that are representative of the technology behind the present invention, and the present invention is not intend to limit the light emitting device to that described in the embodiments. In addition, the members described in claims are by no means limited to the members described in the embodiments. Especially, size, material, shape, and the relative configuration etc. of the components described in the preferred embodiments are for illustration, and do not intend to limit the invention therein, unless specifically described.

Figure 9:
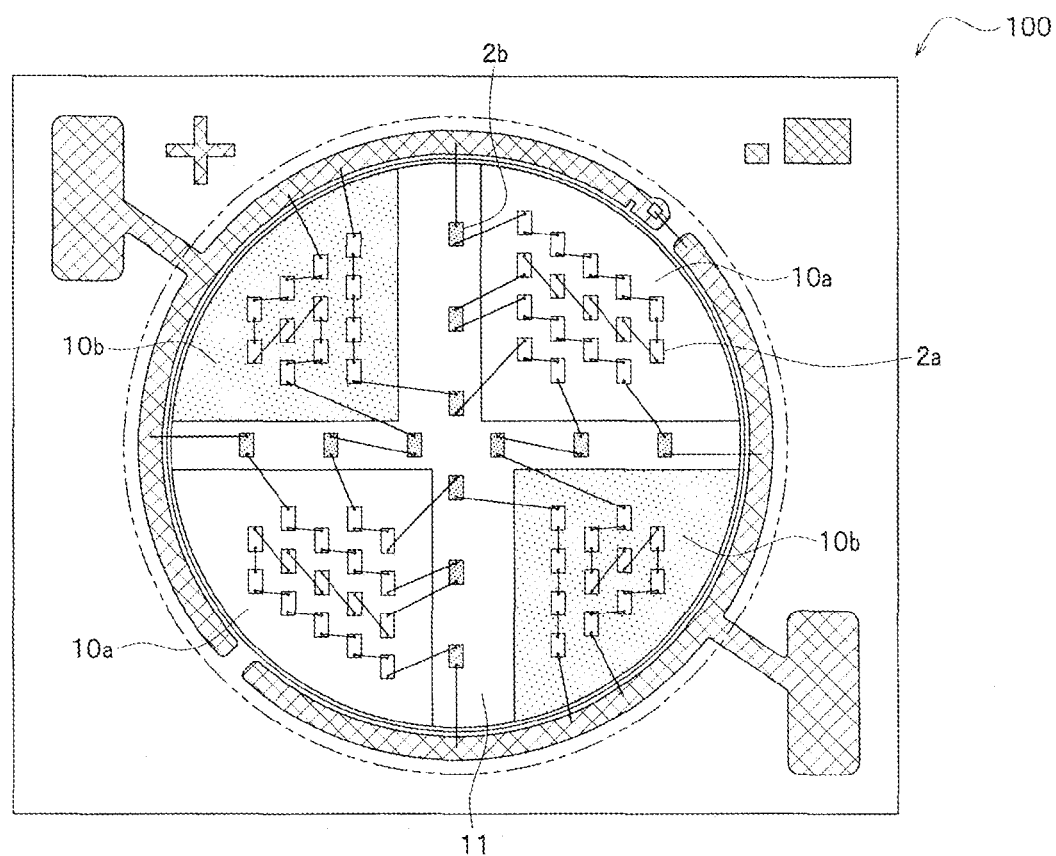
FIG. 9 is a top view showing a structure of a light emitting device according to an another type of Embodiment 1 of the present invention.

For example, as shown in FIG. 9, altering the width of the dividing region 11 such that the width of the parallel straight region in parallel to the longitudinal rows of the light emitting elements 2a, 2b is made wider than the width of the perpendicular straight region which perpendicularly intersects the parallel straight region, the planar dimensions of the second regions 10b, 10b can be made smaller than the planar dimensions of the first regions 10a, 10a.

The first region 10a and the second region 10b may be disposed adjacent (adhered) with each other. Also, the emission wavelength of the first fluorescent material may be longer than the emission wavelength of the second fluorescent material. Further, as the base member 1, a case employing a substrate is illustrated, but a resin package or the like may be employed as the base member 1. Also, the number of the light emitting elements 2a, 2b to be mounted is not limited and two or more first light emitting elements 2a in the two first regions 10a, 10a, and two or more first light emitting elements 2a in the two second regions 10b, 10b are sufficient to be mounted respectively. Also, as the light emitting elements 2a, 2b, a case employing face-up (FU) elements is illustrated, but is not limited thereto, face-down (FD) elements or elements with double sided electrode structure can be also employed. As other embodiment, the wall member 8 may be a non-light-transmissive member. Providing the wall member 8 with a reflective member allows to reflect the light emitted from the first light emitting elements 2a by the wall member, in a similar manner as with the light-reflecting member 6, so that the light extracting efficiency of the first light emitting element 2a can be improved. In this case, for the material of the wall member 8, a similar material of the light-reflecting member 6 can be used.

According to the structure of the light emitting elements and the light emitting devices, the second light emitting 2b, the protective element 5, the light-reflecting member 6, the wall member 8, the transparent member 9, the electrically conductive members 40, the wires W, the metal layer, etc., can be omitted.

DENOTATION OF REFERENCE NUMERALS 1 base member (substrate member)
1a mounting region
2a first light emitting element
2b second light emitting element
3. positive electrode
3a pad portion
3b wiring portion
4 negative electrode
4a pad portion
4b wiring portion
5 protective element
6 light-reflecting member
7a first sealing member
7b second sealing member
8 wall member
9 transparent member
10a first region
10b second region
11 dividing region
40 electrically conductive member
70 position mark 80 temperature measure point
100 light emitting device
AM anode mark
W wire

What is claimed is:
1. A light emitting device, comprising:
a base member;
a plurality of light emitting elements disposed on the base member;
a sealing member sealing the light emitting elements; and
a light-transmissive wall member disposed on the base member and extending in a radial manner from a point on the base member to an outer periphery of the base member,
wherein the base member has a plurality of regions, including a first region and an adjacent second region, divided by the light-transmissive wall member,
wherein the sealing member comprises:
a first sealing member that contains a first fluorescent material and is disposed in the first region so as to contact the light-transmissive wall member, and
a second sealing member that contains a second fluorescent material and is disposed in the second region so as to contact the light-transmissive wall member,
wherein a color tone of light emitted from the first region differs from a color tone of light emitted from the second region,
wherein a plurality of the light emitting elements are disposed in the first region and a plurality of the light emitting elements are disposed in the second region, and
wherein at least one of the light emitting elements disposed in the first region is connected in series with at least one of the light emitting elements disposed in the adjacent second region.

2. The light emitting device according to claim 1, wherein the first fluorescent material and the second fluorescent material are different from each other.

3. The light emitting device according to claim 1, wherein:
the first fluorescent material is configured to absorb at least a part of light from the light emitting elements and emit light with a longer wavelength than a wavelength of the light from the light emitting elements; and
the second fluorescent material is configured to absorb at least a part of light from the light emitting elements and emit light with a longer wavelength than both the wavelength of the light from the light emitting elements and the wavelength of the light from the first fluorescent material, and
wherein a ratio of a total area of the first region containing the first fluorescent material and a total area of the second region containing the second fluorescent material is 2:3 to 3:2.

4. The light emitting device according to claim 1, wherein the one point of the base member is a center of the base member.

5. The light emitting device according to claim 1, wherein the plurality of regions have a same center angle centering on the one point on the base member.

6. The light emitting device according to claim 5, wherein the center angle is 90°.

7. The light emitting device according to claim 1, further comprising a plurality of at least one of the first regions and the second regions, and a group of the plurality of the first regions each other or a group of the plurality of the second regions each other are at locations rotated 180° around the one point of the base member as a center point.

8. The light emitting device according to claim 1, wherein the light emitting device comprises a plurality of the first regions and a plurality of the second regions, and are at locations rotated 180° around the one point of the base member relative to the second regions.

9. The light emitting device according to claim 1, further comprising one or more second light emitting elements in the light-transmissive wall member.

10. The light emitting device according to claim 1, wherein the light-transmissive wall member does not contain a fluorescent material.

11. The light emitting device according to claim 3, wherein a white light is generated by mixing (i) light emitted from the light emitting elements and passing through the sealing member without being absorbed by the first fluorescent material and the second fluorescent material, (ii) light from the first fluorescent material, and (iii) light from the second fluorescent material.

12. The light emitting device according to claim 9, wherein the second light emitting elements emit light of a wavelength between a wavelength of light from the light emitting element and a wavelength of light from the first fluorescent material.

13. The light emitting device according to claim 3, wherein the light emitting elements are light emitting elements configured to emit a blue light, the first fluorescent material is fluorescent material configured to emit a yellow light, and the second fluorescent material is fluorescent material configured to emit a red light.

14. The light emitting device according to claim 12, wherein the second light emitting elements are light emitting elements configured to emit a blue-green light.

15. The light emitting device according to claim 9, wherein at least one of the light emitting elements in the first or second region is connected in series with at least one of the second light emitting elements.

16. The light emitting device according to claim 1, further comprising a transparent member covering the sealing member.

17. The light emitting device according to claim 1, wherein at least one of the light emitting elements disposed in the first region and at least one of the light emitting elements disposed in the second region are in electrical communication with one positive terminal and one negative terminal.

* * * * *